(12) United States Patent
Nakai

(10) Patent No.: US 7,760,545 B2
(45) Date of Patent: Jul. 20, 2010

(54) SEMICONDUCTOR MEMORY DEVICE AND PROGRAMMING METHOD THEREOF

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 168 days.

(21) Appl. No.: 11/955,879

(22) Filed: Dec. 13, 2007

(65) Prior Publication Data
US 2008/0149912 A1    Jun. 26, 2008

(30) Foreign Application Priority Data

Dec. 26, 2006  (JP) ............... 2006-349651
Nov. 7, 2007   (JP) ............... 2007-289550

(51) Int. Cl.
*G11C 11/00* (2006.01)
(52) U.S. Cl. .................. 365/163; 365/148; 365/189.09
(58) Field of Classification Search ................. 365/163, 365/148, 189.09
See application file for complete search history.

(56) References Cited

U.S. PATENT DOCUMENTS 6,900,517 B2 *  5/2005  Tanaka et al. ............... 257/532
7,291,857 B2 * 11/2007  Tanaka et al. ................. 257/4
7,304,885 B2 * 12/2007  Cho et al. .................... 365/163
7,423,898 B2 *  9/2008  Tanizaki et al. ............. 365/148

FOREIGN PATENT DOCUMENTS

| JP | 2000-132992 A | 5/2000 |
|----|---------------|--------|
| JP | 2000-208637 A | 7/2000 |
| JP | 2005-158199 A | 6/2005 |
| JP | 2006-24355 A  | 1/2006 |

* cited by examiner

*Primary Examiner*—Pho M. Luu
(74) *Attorney, Agent, or Firm*—Sughrue Mion, PLLC

(57) ABSTRACT

A semiconductor memory device is provided that has a storage unit that includes an interlayer insulation film, a lower electrode layer embedded in the interlayer insulation film, and a recording layer and an upper electrode layer provided on the interlayer insulation film. When a predetermined current is passed to the storage unit, the recording layer is heated by substantially exceeding a melting point, and a cavity is formed near the interface between the recording layer and the lower electrode layer. As a result, the recording layer is physically separated from the lower electrode layer, and no current flows through the storage unit. When the recording layer is physically separated from the lower electrode layer, these layers cannot be returned to the contact state again. Therefore, information can be stored irreversibly.

26 Claims, 23 Drawing Sheets

SEMICONDUCTOR MEMORY DEVICE AND PROGRAMMING METHOD THEREOF

TECHNICAL FIELD

The present invention relates to a semiconductor memory device and a programming method thereof, and, more particularly to a semiconductor memory device using a variable resistance material of which electric resistance can reversibly change like a phase change material, and a programming method thereof.

BACKGROUND OF THE INVENTION

In personal computers or servers, hierarchically constructed various storage devices are used. A lower-hierarchical storage device is required to be low price and has a large capacity, while a higher-hierarchical one is required to be capable of high-speed access. As a lowest-hierarchical storage device, a magnetic storage such as a hard disk drive and a magnetic tape is generally used. The magnetic storage is nonvolatile and capable of saving a considerably large amount of data at a lower price as compared to a semiconductor memory device or the like. However, the magnetic storage is slow in access speed, and does not have random accessibility in many cases. Therefore, a program or data to be saved for a long period is stored in the magnetic storage, and is optionally changed to a higher-hierarchical storage device.

A main memory is a storage device higher in hierarchy than the magnetic storage. Generally, a DRAM (Dynamic Random Access Memory) is used for the main memory. The DRAM can be accessed at higher speed as compared to the magnetic storage, and in addition, the DRAM has the random accessibility. Further, the DRAM has a characteristic that a cost-per-bit is lower in price than a high-speed semiconductor memory such as an SRAM (Static Random Access Memory).

A highest-hierarchical storage device is an internal cache memory included in an MPU (Micro Processing Unit). The internal cache memory is connected via an internal bus to a core of the MPU, and thus, it can be accessed at remarkably high speed. However, a recording capacity to be secured is considerably small. As a storage device that configures a hierarchy between the internal cache and the main memory, a secondary cache, or a tertiary cache, or the like is used occasionally.

The reason that the DRAM is selected as the main memory is that it has a very good balance between the access speed and the cost-per-bit. Further, the DRAM has a large capacity among the semiconductor memories, and recently, a chip with a capacity of 1 gigabit or more has been developed. However, the DRAM is a volatile memory, and stored data is lost when the power is turned off. Thus, the DRAM is not suitable for a program or data to be save for a long period. In the DRAM, a refresh operation needs to be periodically performed to save the data even while the power supply is turned on. Thus, there is a limit to reduction in power consumption, and there is a problem that complicated control by a controller is needed.

As a nonvolatile semiconductor memory of large capacity, a flash memory is known. However, the flash memory has disadvantages in that a large amount of electricity is needed to write and delete the data, and a writing time and a deleting time are very long. Accordingly, it is not appropriate to replace the DRAM as the main memory. Other nonvolatile memories that have been proposed include an MRAM (Magnetoresistive Random Access Memory), an FRAM (Ferroelectric Random Access memory) or the like. However, it is difficult to obtain a storage capacity equal to that of the DRAM.

On the other hand, as a semiconductor memory that replaces the DRAM, a PRAM (Phase change Random Access Memory) in which a phase change material is used to record is proposed (see Japanese Patent Application Laid-open Nos. 2006-24355 and 2005-158199). In the PRAM, the data is stored by a phase state of the phase change material included in a recording layer. That is, the phase change material differs greatly in electrical resistance between a crystalline phase and an amorphous phase. The data can be stored by using this characteristic.

The phase state can be changed by applying a write current to the phase change material, which heats the phase change material. Data-reading is performed by applying a read current to the phase change material and sensing the resistance value. The read current is set to a value sufficiently small as compared to the write current so that no phase change occurs. Thus, the phase state of the phase change material does not change unless a high heat is applied thereto, and accordingly, even when the power is turned off, the data is not lost.

Not only the PRAM, but also substantially all semiconductor memory devices include defective memory cells due to a manufacturing failure. These defective memory cells are usually replaced by redundant memory cells, thereby relieving defective addresses.

Generally, a defective address is stored in a program circuit which includes plural fuse elements. When an access to a defective address is requested, the above program circuit detects this, and accordingly, performs a replacement access to the redundant memory cell instead of the defective memory cell.

There are broadly two methods of disconnecting a fuse element: a method of melting the fuse element by a large current; and a method of destroying the fuse element by irradiating a laser beam. The former method requires no expensive device such as a laser trimmer, and has an advantage in that a self diagnosis can be easily performed regarding whether the fuse element is disconnected correctly. However, to melt the fuse element including such as polycrystalline silicon using a large current, substantially a large current is necessary. Therefore, a large-scale fuse disconnection circuit and a diagnosis circuit need to be built in the inside of the semiconductor memory device. This causes a problem of the increase in the chip area.

On the other hand, the latter method can decrease the chip area because of no need to build the fuse disconnection circuit inside of the semiconductor memory device. However, according to this method, a passivation film is destroyed by the irradiation of the laser beam, and moisture enters this destroyed part. As a result, reliability of the product decreases.

In recent years, there has been proposed a method of storing a defective address using an element called an antifuse (see Japanese Patent Application Laid-open Nos. 2000-132992 and 2000-208637). The antifuse is an element that becomes in the nonconductive state in the initial state, and becomes in the conductive state when a write operation is performed, unlike the normal fuse element. However, even when the write operation is performed to the antifuse, a large variation occurs in the conductive state. Therefore, a sense circuit and the like are necessary to determine whether the antifuse is in the nonconductive state or the conductive state. Accordingly, the circuit scale becomes large.

As explained above, the program circuit for storing the defective address has advantages and disadvantages depending on a kind of the program circuit. Regarding the PRAM, a suitable program circuit needs to be selected considering this point. Because the PRAM is a nonvolatile memory, the memory cell itself of the PRAM can be considered to be used as a part of the program circuit. In other words, there is considered a method that the phase change material contained in the memory cell is set in a crystal state or an amorphous state corresponding to the defective address to be stored, at the manufacturing time.

However, the crystallization temperature of the phase change material is relatively low of about 150° C. Therefore, even when the program is completed correctly in the wafer state, the phase change material is entirely crystallized by reflow performed at the packaging time or the mounting time, and the programmed content is erased. Accordingly, it is actually difficult to use the memory cell itself of the PRAM as a part of the program circuit.

On the other hand, a RRAM (Resistive Random Access Memory) using a magnetoresistive material of which electric resistance changes due to the application of a voltage pulse is also known. However, because the program content of the RRAM also has a possibility of being changed by the reflow, the use of the memory cell itself of the PRAM as a part of the program circuit is considered difficult.

As explained above, even when information of the defective address is stored in the memory cell of the PRAM or RRAM before packaging or mounting, it has been difficult to hold this information after packaging or mounting.

The above problems can happen not only to the program circuit for storing the defective address, but also to a case of providing a program circuit for storing a user program or a vendor program apart from a data area. For example, in a flash memory or the like, there are cases of providing an OTP (One Time Programming) area in which writing is possible for only once. A user program, a vendor program or the like are stored in the OTP area, and the program once stored in the OTP area cannot be erased thereafter. That is, irreversible nonvolatile storage can be performed. When such an OTP area is provided in a PRAM or a RRAM, if a PRAM element or a RRAM element is used for the OTP area, contents of the program may be destroyed by reflow.

SUMMARY OF THE INVENTION

Therefore, an object of the present invention is to provide an improved semiconductor memory device having a variable resistance material of which electric resistance can reversibly change.

Another object of the present invention is to provide a semiconductor memory device that can irreversibly store information using a variable resistance material of which electric resistance can reversibly change.

Still another object of the present invention is to provide a nonvolatile semiconductor memory device having an improved program circuit.

Still another object of the present invention is to provide a semiconductor memory device that can hold information stored before packaging or mounting, in a memory element having a variable resistance material of which electric resistance can change reversibly, after packaging or mounting.

Still another object of the present invention is to provide a method for programming the semiconductor memory device like the above mentioned.

The semiconductor memory device according to one aspect of the present invention comprising: a recording layer including a variable resistance material of which electric resistance can reversibly change; an electrode layer which is in contact with the recording layer; a write circuit which physically separates the recording layer from the electrode layer by passing a current to between the recording layer and the electrode layer; and a detection circuit that detects a connection state between the recording layer and the electrode layer by applying a voltage to between the recording layer and the electrode layer.

While the type of the variable resistance material is not particularly limited, a phase change material of which electric resistance changes depending on a phase state and a magnetoresistive material of which electric resistance changes due to the application of a voltage pulse can be also used. Particularly, the phase change material is most suitable as a material of a recording layer in the present invention, because the phase change material has a relatively low melting point.

According to the present invention, information is stored based not on a resistance state of the variable resistance material contained in the recording layer but on presence or absence of a physical contact between the recording layer and the electrode layer. In other words, when the recording layer and the electrode layer are physically in contact with each other, current flows to these layers, and when the recording layer and the electrode layer are not physically in contact with each other, no current flows to these layers. Therefore, information can be stored irreversibly.

The information irreversibly stored in this way can be used for various kinds of usages. For example, when a defective address is stored in a storage unit including the recording layer and the electrode layer described above, the storage unit can be used as a fuse element of the program circuit. Alternatively, if a vendor program or the like is stored in the storage unit, it can be used as a memory cell in an OTP area. In these cases, it is preferable that a memory cell storing user data has a nonvolatile memory element, and this nonvolatile memory element has a configuration substantially the same as that of the storage unit described above. With this arrangement, the nonvolatile memory element and the fuse element can be formed in the same process.

Further, according to another aspect of the present invention, the semiconductor memory device includes a first memory cell capable of reversibly performing nonvolatile storage, and a second memory cell capable of irreversibly performing nonvolatile storage, wherein each of the first and the second memory cells includes a recording layer containing a variable resistance material of which electric resistance can reversibly change, and an electrode layer which is in contact with the recording layer.

According to the present invention, user data can be stored in the first memory cell, and a defective address and a vender program can be stored in the second memory cell. Preferably, the first memory cell and the second memory cell have mutually substantially identical configurations. In this case, the first memory cell can perform reversible nonvolatile storage by changing the electric resistance of the variable resistance material contained in the recording layer, and the second memory cell can perform irreversible nonvolatile storage by physically separating the recording layer from the electrode layer.

The programming method of the semiconductor memory device according to one aspect of the present invention for programming a defective address in the semiconductor memory device which including: a plurality of bit lines; a plurality of word lines crossing the plurality of bit lines; a plurality of memory cells located at intersections between the bit lines and the word lines; and a fuse element that stores an address of a defective memory cell, wherein the memory cell has a recording layer and an electrode layer connected in series with a corresponding bit line, the recording layer includes a variable resistance material of which electric resistance can reversibly change, and the fuse element has substantially the same configuration as that of a nonvolatile memory element included in the memory cell, comprising an address specification step of specifying an address of a defective memory cell; and a write step of physically separating the recording layer from the electrode layer constituting a predetermined fuse element, corresponding to a specified defective address.

According to the present invention, the defective address is held in the fuse element based on presence or absence of a physical contact between the recording layer and the electrode layer. Therefore, the defective address stored before packaging or mounting can be held after packaging or mounting.

As explained above, according to the present invention, information is stored based not on a resistance state of the variable resistance material contained in the recording layer but on presence or absence of a physical contact between the recording layer and the electrode layer. Therefore, information can be stored irreversibly using the variable resistance material. Consequently, when the present invention is applied to a PRAM, information can be held in the phase state of the phase change material contained in the recording layer for the nonvolatile memory element contained in the memory cell, and information can be held based on presence or absence of a physical contact between the recording layer and the electrode layer for the fuse element.

With this arrangement, in the semiconductor memory device using the variable resistance material of which electric resistance can reversibly change such as a PRAM and an RRAM, information of which irreversible nonvolatile storage is required such as a defective address and a vendor program can be stored before packaging or before mounting.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below in detail with reference to the accompanying drawings.

Figure 1:
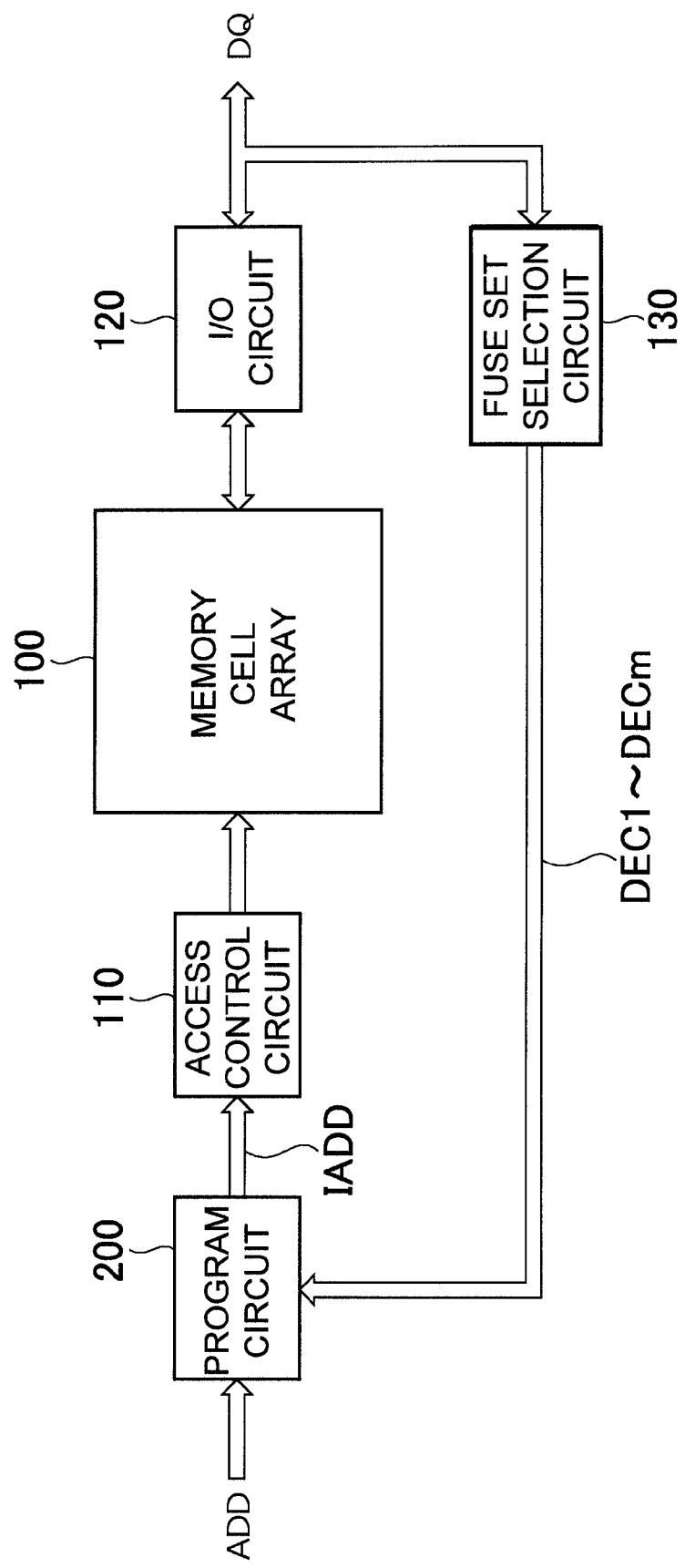
FIG. 1 is a block diagram schematically showing an entire configuration of a semiconductor memory device according to a first embodiment of the present invention.

FIG. 1 is a block diagram schematically showing an entire configuration of a semiconductor memory device according to a first embodiment of the present invention.

As shown in FIG. 1, the semiconductor memory device according to the first embodiment has a memory cell array 100. It is possible to access the memory cell array 100 by supplying an address signal ADD from the outside. Input and output data DQ is inputted to or outputted from the accessed memory cell. An access control circuit 110 accesses the memory cell array 100, and an I/O circuit 120 transfers the input and output data DQ.

The address signal ADD becomes an internal address IADD after passing a program circuit 200, and the internal address IADD is supplied to the access control circuit 110. The program circuit 200 is a circuit that stores a defective address contained in the memory cell array 100. When the stored defective address is supplied to the program circuit 200, the program circuit 200 replaces this defective address with an alternative address, and supplies this alternative address to the access control circuit 110. Accordingly, the access control circuit 110 accesses a redundant memory cell included in the memory cell array 100, and can relieve the defective address.

As is described below, the program circuit 200 includes plural fuse sets. To write the defective address into the program circuit 200, a predetermined fuse set is selected using fuse set selection signals DEC1 to DECm as outputs of a fuse set selection circuit 130, and supplies the defective address to the program circuit 200 in this state. The fuse set selection circuit 130 can generate the fuse set selection signals DEC1 to DECm by decoding the input data, for example.

Figure 2:
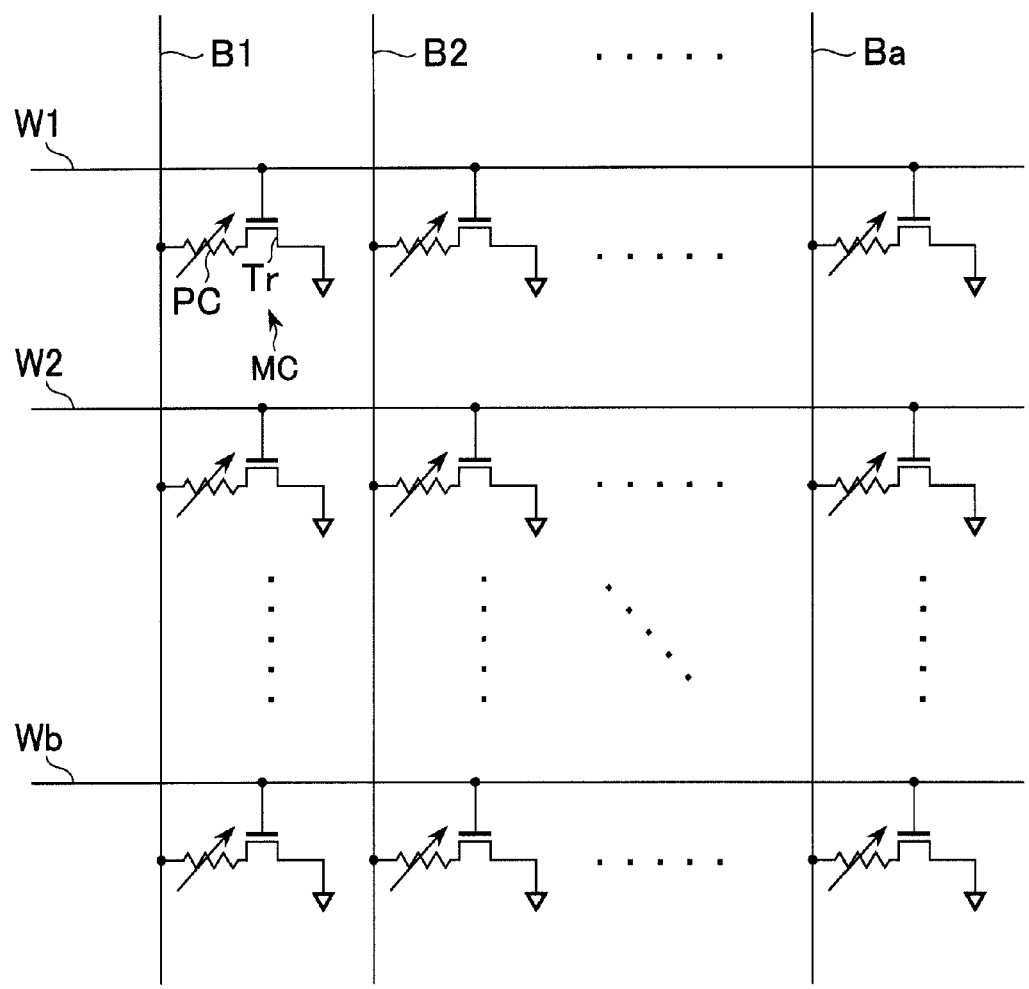
FIG. 2 is a circuit diagram showing a configuration of the memory cell array shown in FIG. 1.

FIG. 2 is a circuit diagram showing a configuration of the memory cell array 100.

As shown in FIG. 2, the memory cell array 100 includes plural bit lines B1 to Ba, plural word lines W1 to Wb crossing these bit lines, and plural memory cells MCs located at intersections between the bit lines and the word lines. Each memory cell MC includes a nonvolatile memory element PC and a transistor Tr connected in series between the corresponding bit line and a reference potential (or a source wiring). A gate electrode of the transistor Tr is connected to the corresponding word line.

Figure 3:
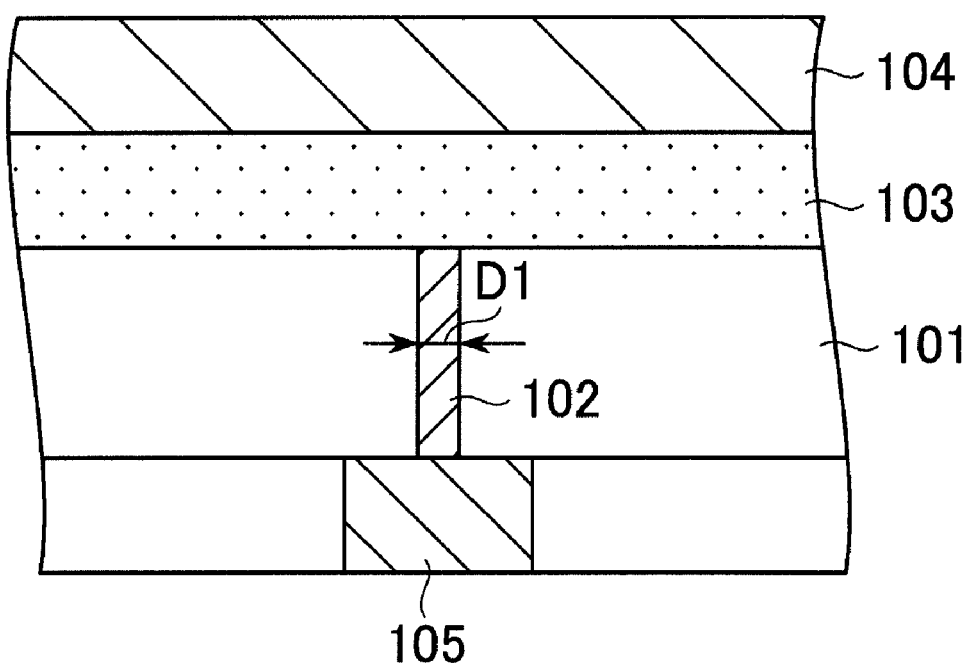
FIG. 3 is a cross sectional diagram showing a configuration of the nonvolatile memory element PC.

FIG. 3 is a cross sectional diagram showing a configuration of the nonvolatile memory element PC.

As shown in FIG. 3, the nonvolatile memory element PC includes an interlayer insulation film 101, a lower electrode layer 102 embedded in the interlayer insulation film 101, and a recording layer 103 and an upper electrode layer 104 that are provided on the interlayer insulation film 101. The upper electrode layer 104 is an electrode layer connected to the bit line. Alternatively, the upper electrode layer 104 itself can be a bit line. The lower electrode layer 102 is connected to a lower wiring layer 105, and is connected to a corresponding transistor Tr (not shown) via the wiring layer 105.

The lower electrode layer 102 is used as a heater plug. In other words, the lower electrode layer 102 becomes a part of a heating element at the data writing time. Therefore, a material having a relatively high electric resistance, such as metal silicide, metal nitride, and a nitride of metal silicide are preferably used as materials of the lower electrode layer 102. Although not particularly limited, high-melting point metals and nitrides of those such as W, TiN, TaN, WN, and TiAlN, nitrides of high-melting point metal silicide such as TiSiN and WSiN, and a material such as TiCN can be preferably used for the material of the lower electrode layer 102.

The recording layer 103 includes a variable resistance material of which electric resistance can reversibly change, and includes a phase change material in the first embodiment. The phase change material constituting the recording layer 103 is not particularly limited so long as the material has two or more phase states and the electric resistance is different depending on the phase state. What is called a calcogenide material is preferably selected. The calcogenide material is an alloy containing at least one of elements of germanium (Ge), antimony (Sb), tellurium (Te), indium (In), and selenium (Se). For example, the calcogenide material includes a two-element element such as GaSb, InSb, InSe, $Sb_2Te_3$, and GeTe, a three-element element such as $Ge_2Sb_2Te_5$, InSbTe, GaSeTe, $SnSb_2Te_4$, and InSbGe, and a four-element element such as AgInSbTe, (GeSn)SbTe, GeSb(SeTe), and $Te_{81}Ge_{15}Sb_2S_2$.

The phase change material containing the calcogenide material can take a phase state of either an amorphous phase or a crystalline phase. The phase change material becomes in a relatively high resistance state in the amorphous phase, and becomes in a relatively low resistance state in the crystalline phase.

Figure 4:
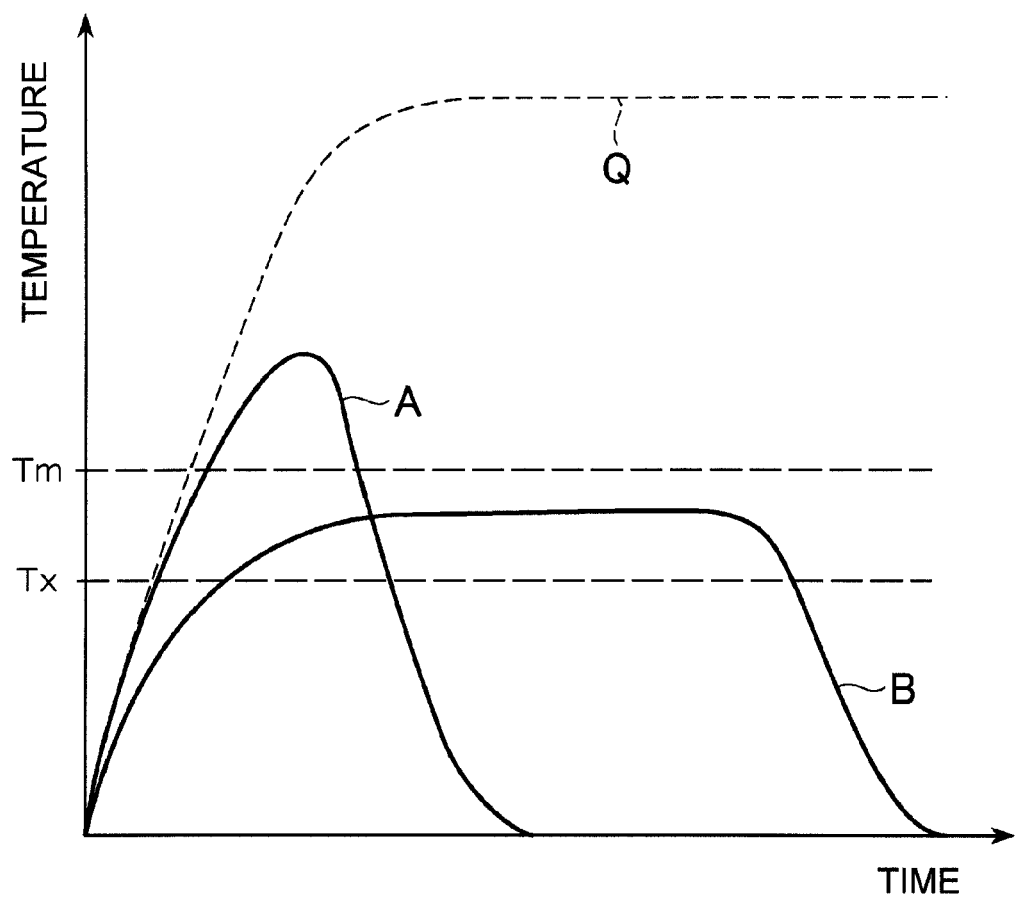
FIG. 4 is a graph for explaining a method of controlling a phase state of the phase change material containing the calcogenide material.

FIG. 4 is a graph for explaining a method of controlling a phase state of the phase change material containing the calcogenide material.

To set the phase change material containing the calcogenide material to the amorphous state, the phase change material is once heated to a temperature equal to or above a melting point Tm and is then cooled, as indicated by a curve A in FIG. 4. On the other hand, to set the phase change material containing the calcogenide material to the crystalline state, the phase change material is once heated to a temperature equal to or above a crystallizing temperature Tx and less than the melting point Tm, and is then cooled after maintaining the heated state for some time, as indicated by a curve B in FIG. 4. The phase change material can be heated by current conduction. A temperature at the heating time can be controlled based on the amount of current conduction, that is, the amount of current per unit time or a current conduction time.

Figure 5:
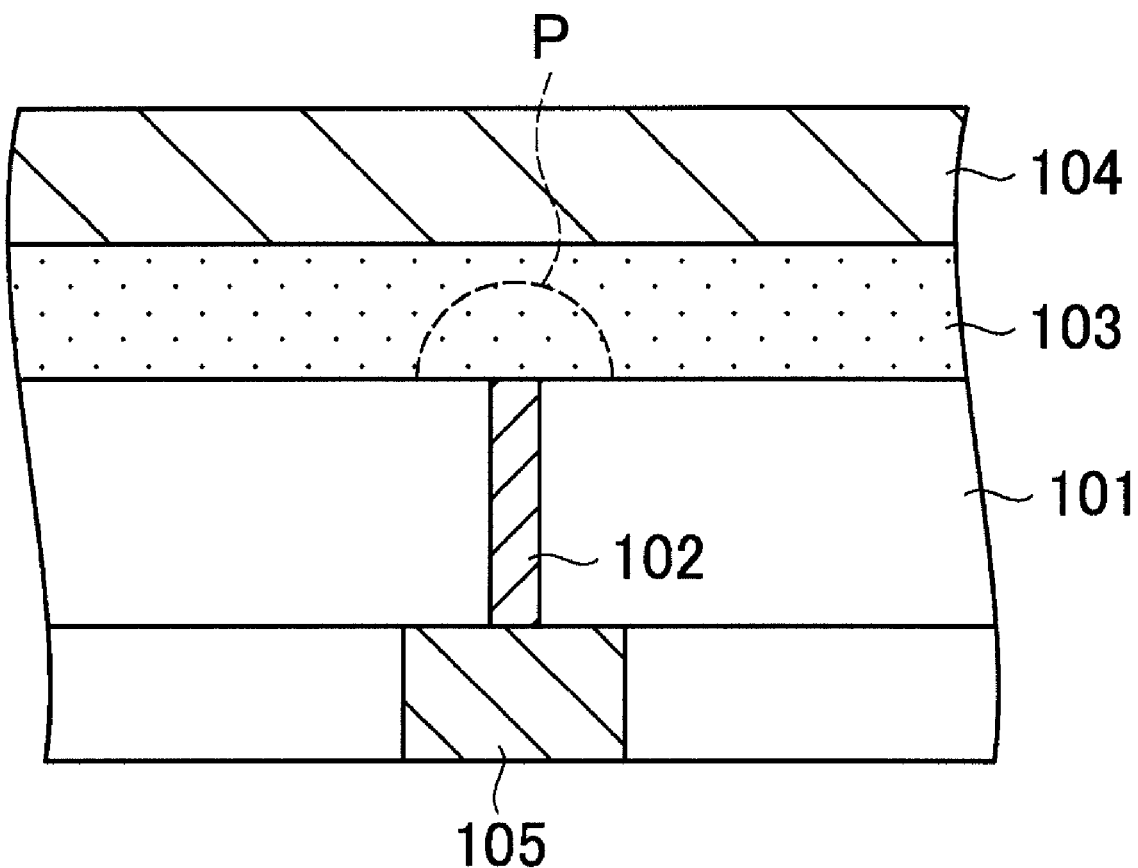
FIG. 5 is a cross sectional diagram for explaining a location of a phase change area P in the nonvolatile memory element PC.

When a write current is passed to the recording layer 103, a part of the recording layer 103 immediately above the lower electrode layer 102 is heated. In other words, by passing the write current to the recording layer 103, the phase state of the calcogenide material can be changed in a phase change area P as shown in FIG. 5. The phase change area P is an area that is in contact with the lower electrode layer 102. Therefore, when the phase change area P is in the crystalline state, a part between the lower electrode layer 102 and the upper electrode layer 104 becomes in the low resistance state. When the phase change area P is in the amorphous state, the part between the lower electrode layer 102 and the upper electrode layer 104 becomes in the high resistance state. By using this difference, information can be stored in the nonvolatile memory element PC.

The memory cell array 100 includes many memory cells MCs having the nonvolatile memory element PC, and can store desired user data.

Figure 6:
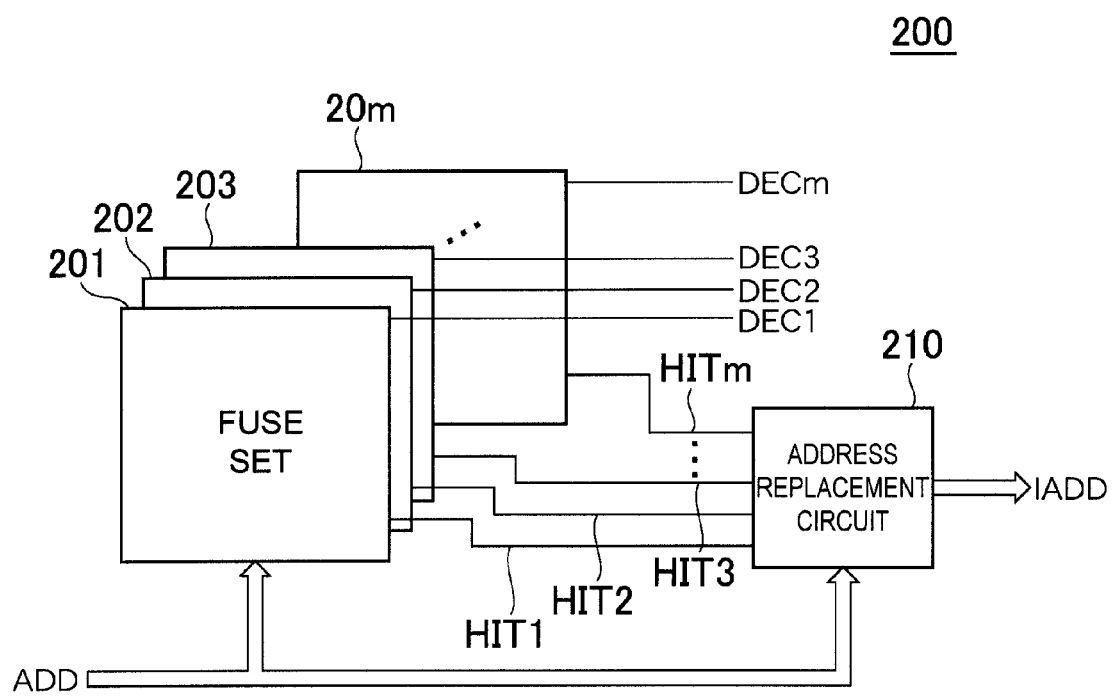
FIG. 6 is a block diagram showing a configuration of the program circuit shown in FIG. 1.

FIG. 6 is a block diagram showing a configuration of the program circuit 200.

As shown in FIG. 6, the program circuit 200 includes plural fuse sets 201 to 20m and an address replacement circuit 210. The fuse sets 201 to 20m are circuit units that store defective addresses, respectively. Therefore, in the present example, these fuse sets can store m defective addresses. Fuse set selection signals DEC1 to DECm are supplied to the fuse sets 201 to 20m, respectively, thereby making it possible to individually select the fuse sets 201 to 20m at the time of writing the defective addresses. The address signal ADD is supplied in common to the fuse sets 201 to 20m. When a coincidence between the address signal ADD and the stored defective address is detected, detection signals HIT1 to HITm are activated.

The detection signals HIT1 to HITm are supplied to the address replacement circuit 210. When any one of the detection signals HIT1 to HITm is activated, the address replacement circuit 210 replaces the address signal ADD with an alternative address, and supplies this to the access control circuit 110 as the internal address IADD. On the other hand, when all the detection signals HIT1 to HITm are in the inactive state, the address replacement circuit 210 supplies the address signal ADD to the access control circuit 110 as the internal address IADD, without replacing the address signal ADD with the alternative address.

Figure 7:
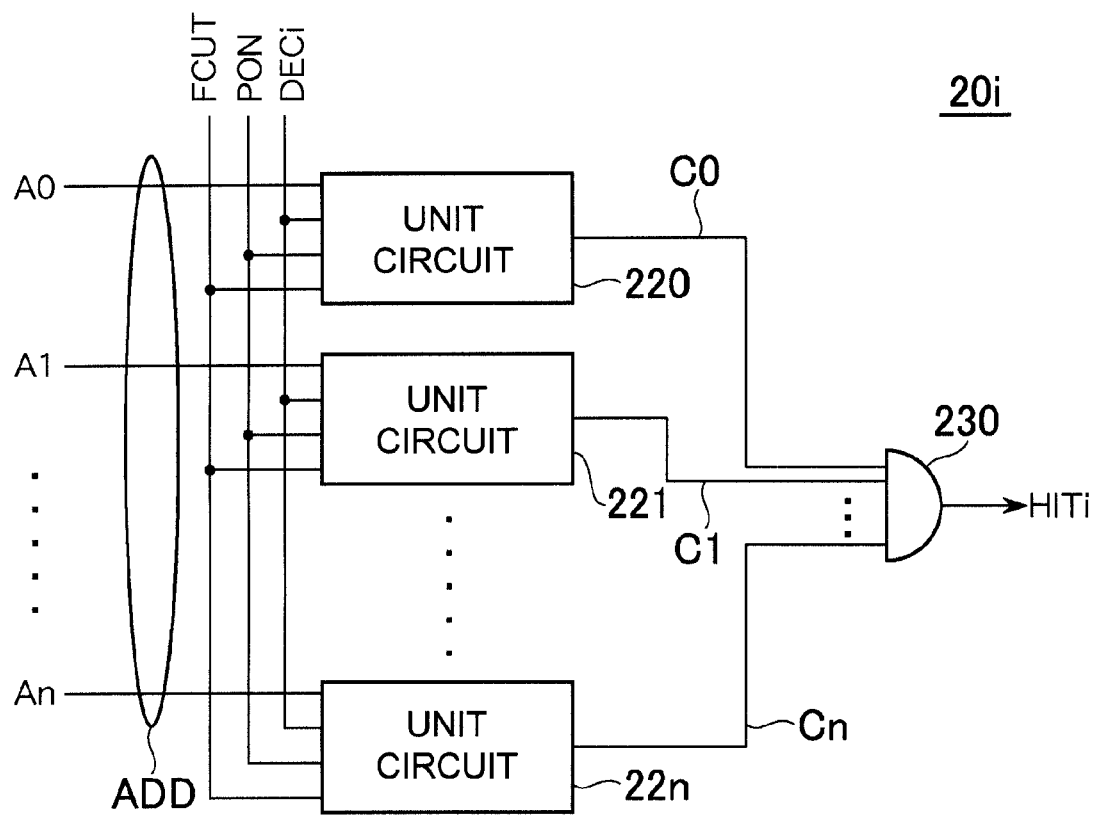
FIG. 7 is a circuit diagram showing a configuration of one fuse set shown in FIG. 6.

FIG. 7 is a circuit diagram showing a configuration of one fuse set 20i (i=1 to m).

As shown in FIG. 7, one fuse set 20i includes plural unit circuits 220 to 22n corresponding to bits (A0 to An) of the address signal ADD, respectively, and an AND (logical product) circuit 230 that receives coincidence signals C0 to Cn from the unit circuits 220 to 22n. The unit circuits 220 to 22n are circuits that store corresponding one bit of the defective addresses, respectively, and activate the coincidence signals C0 to Cn to the high level when the corresponding one bit of the defective address coincides with the corresponding one bit of the address signal ADD.

Therefore, when all the coincidence signals C0 to Cn become at the high level, the AND circuit 230 activates the detection signal HITi to the high level. The detection signal HITi is supplied to the address replacement circuit 210 as shown in FIG. 6.

Figure 8:
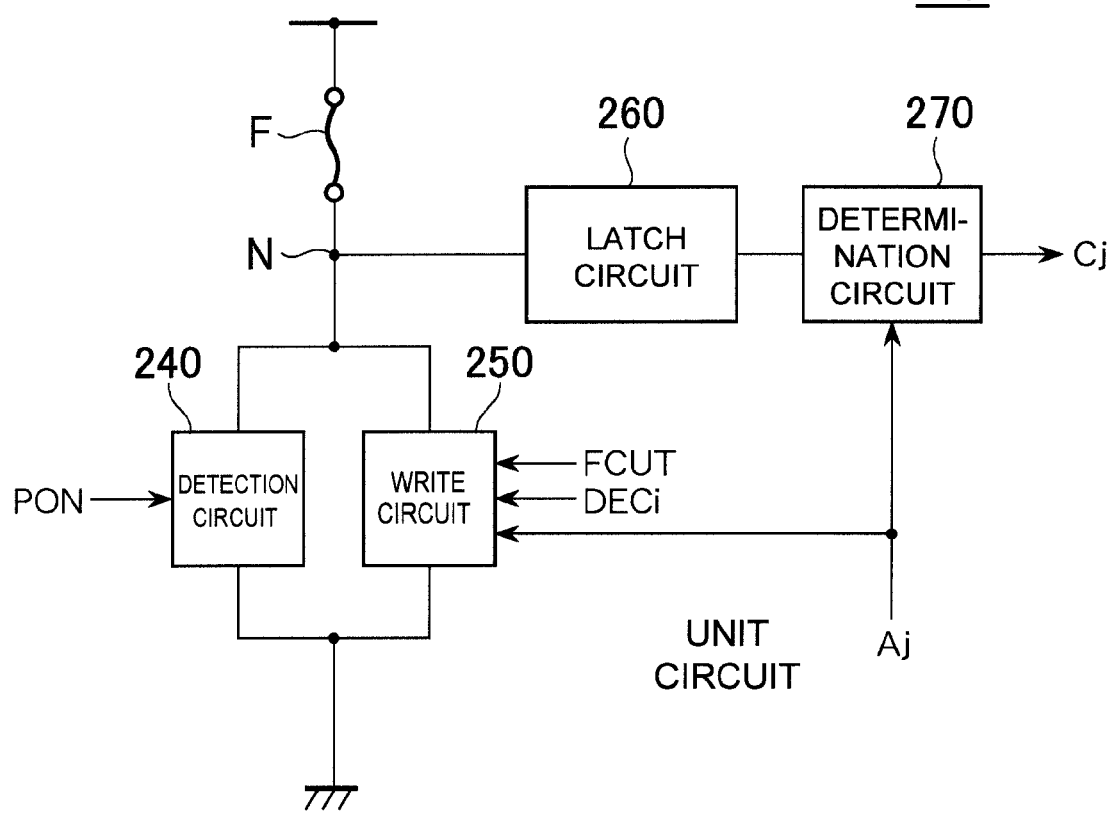
FIG. 8 is a block diagram showing a basic configuration of one unit circuit shown in FIG. 7.

FIG. 8 is a block diagram showing a basic configuration of one unit circuit 22j (j=0 to n).

As shown in FIG. 8, the one unit circuit 22j has a fuse element F constituting a storage unit. One end of the fuse element F is connected to a power source wiring, and a contact node N as the other end of the circuit is connected to a detection circuit 240, a write circuit 250, and a latch circuit 260.

The detection circuit 240 is a circuit that detects a connection state of the fuse element F, and performs a detection operation in response to a power on signal PON activated at the reset time of the semiconductor memory device. The write circuit 250 is a circuit that disconnects the fuse element F, and performs a disconnection operation in response to a fuse disconnection signal FCUT, a corresponding bit Aj in the address signal ADD, and a corresponding fuse set selection signal DECi. The latch circuit 260 is a circuit that latches a logic level of the contact node N, and the latched logic level is supplied to a determination circuit 270. The determination circuit 270 is a circuit that compares the latched logic level with the logic level of the corresponding bit Aj in the address signal ADD. When the latched level coincides with the logic level of the bit Aj, the determination circuit 270 activates a coincidence signal Cj.

Figure 9:
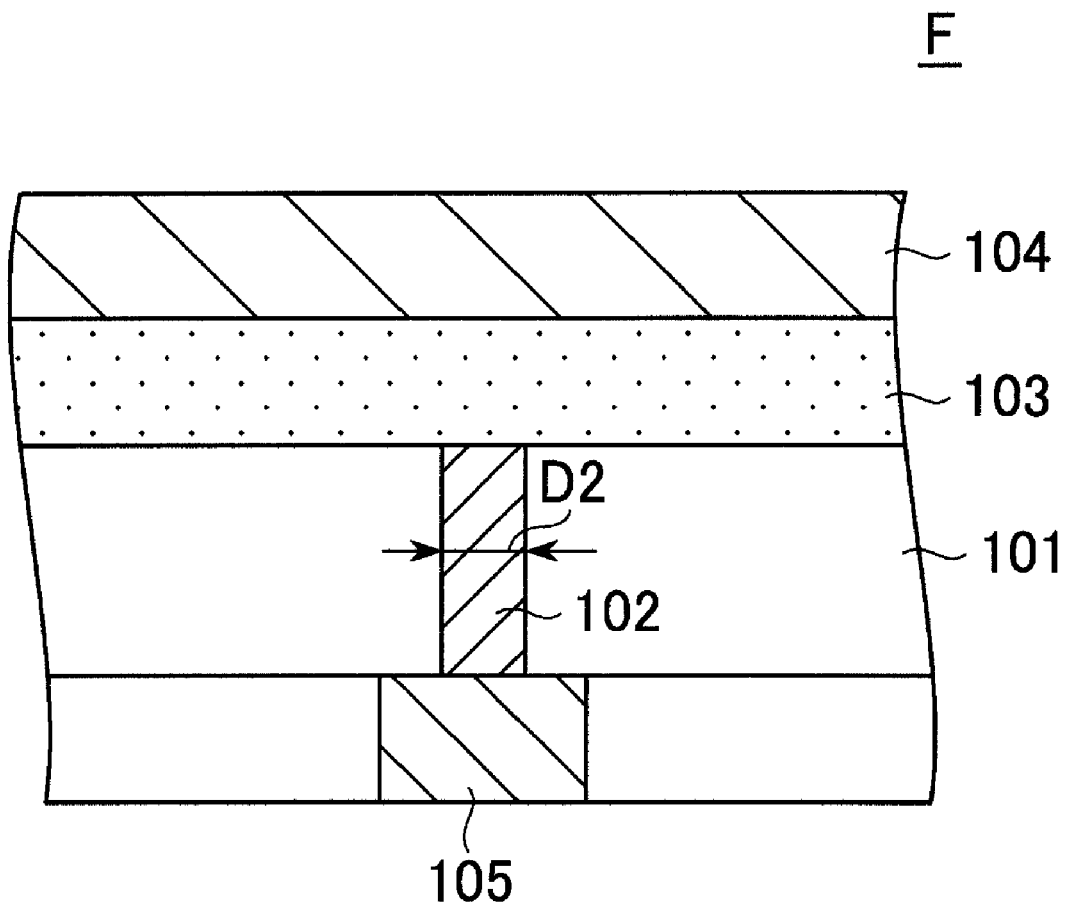
FIG. 9 is a cross-sectional diagram showing a configuration of the fuse element F.

FIG. 9 is a cross-sectional diagram showing a configuration of the fuse element F.

As shown in FIG. 9, the fuse element F has a configuration substantially similar to that of the nonvolatile memory element PC shown in FIG. 3. In other words, the fuse element F includes the interlayer insulation film 101, the lower electrode layer 102 embedded in the interlayer insulation film 101, and the recording layer 103 and the upper electrode layer 104 that are provided on the interlayer insulation film 101. The upper electrode layer 104 is an electrode layer connected to the power source wiring. Alternatively, the upper electrode layer 104 itself can be the power source wiring. The lower electrode layer 102 is connected to the lower wiring layer 105, and this wiring layer 105 becomes the contact node N shown in FIG. 8.

The interlayer insulation film 101, the lower electrode layer 102, the recording layer 103, the upper electrode layer 104, and the wiring layer 105 are formed simultaneously in the same process as that of the elements constituting the nonvolatile memory element PC. Therefore, an additional process of forming the fuse element F is not necessary.

As explained above, the fuse element F has the same configuration as that of the nonvolatile memory element PC. However, the recording layer 103 included in the fuse element F does not store information by changing the phase state of the phase change material layer, but stores information based on presence or absence of a physical contact between the recording layer 103 and the lower electrode layer 102.

In other words, in the initial state immediately after the manufacturing, the recording layer 103 and the lower electrode 102 are in contact with each other as shown in FIG. 9, and the current can be passed to the fuse element F. Therefore, when the power source voltage is applied to between the recording layer 103 and the lower electrode layer 102 by activating the detection circuit 240 shown in FIG. 8, the potential of the contact node N becomes substantially the power source potential.

Figure 10:
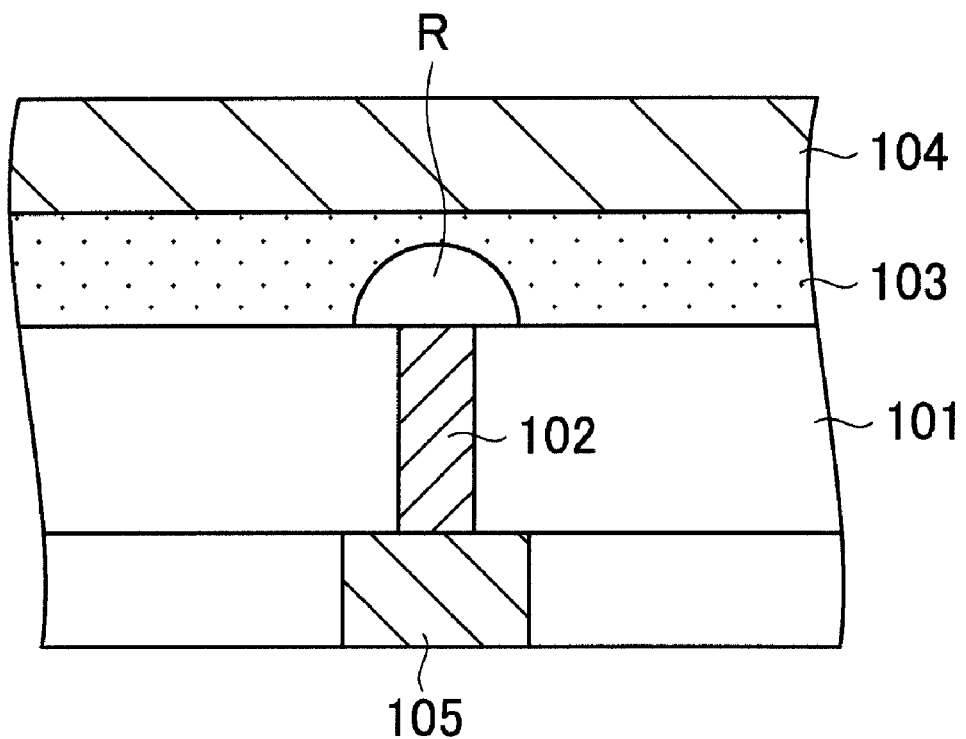
FIG. 10 is a cross sectional diagram showing a state that cavity R is formed in the fuse element F.

On the other hand, when the write circuit 250 shown in FIG. 8 is activated, a large current flows through between the recording layer 103 and the lower electrode layer 102, and the recording layer 103 is heated to a temperature significantly exceeding the melting point Tm of the phase change material, as indicated by a curve Q in FIG. 4. As a result, a part near the interface between the recording layer 103 and the lower electrode layer 102 is destroyed, and a cavity R is formed, as shown in FIG. 10. Because the recording layer 103 is physically separated from the lower electrode layer 102 accordingly, no current flows to the fuse element F. Consequently, even when the power source voltage is applied to between the recording layer 103 and the lower electrode layer 102 by activating the detection circuit 240 shown in FIG. 8, the potential of the contact node N substantially becomes the ground potential.

As explained above, when the recording layer 103 is physically separated from the lower electrode layer 102, these layers cannot be returned to the contact state again. Therefore, the fuse element F can irreversibly store information, like the normal fuse element that is disconnected by the irradiation of a laser beam.

Reasons that the phase change material of the calcogenide material and the like is used for the material of the recording layer 103 constituting the fuse element F are as follows. First, the phase change material such as the calcogenide material has a lower melting point than that of other conductive materials such as aluminum (Al) and polycrystalline silicon, and cavity R is easily formed by destruction. Second, according to the semiconductor memory device of the first embodiment, because the memory cell MC has the nonvolatile memory element PC, the fuse element F can be formed simultaneously in the process of forming the nonvolatile memory element PC.

Because the recording layer 103 constituting the fuse element F includes the phase change material, a variation may occurs in the resistance value of the fuse element F even when the recording layer 103 is in the non-disconnected state as shown in FIG. 9, that is, even when the recording layer 103 and the lower electrode layer 102 are in contact with each other. In general, the fuse element F is in the amorphous state immediately after the film formation, and thereafter becomes in the crystalline state in the reflow process and the like. Therefore, the fuse element F in the non-disconnected state should be sufficiently in the low resistance state. However, in actual practice, when the contact area between the recording layer 103 and the lower electrode layer 102 becomes small, a variation of the resistance value in the initial state tends to become large. Particularly, when the diameter of the lower electrode layer 102 is miniaturized like a memory cell, the fuse element F has a high possibility of becoming in the high resistance state even in the non-disconnected state.

Taking the above points into consideration, in the first embodiment, a relationship between a diameter D1 (see FIG. 3) of the lower electrode layer 102 included in the nonvolatile memory cell PC and a diameter D2 (see FIG. 9) of the lower electrode layer 102 included in the fuse element F is set to D1<D2. By providing the above setting, a contact area between the recording layer 103 and the lower electrode layer 102 of the fuse element F increases. Therefore, the fuse element F in the non-disconnected state can be set to the low resistance state more securely. However, this point is not essential in the present invention.

Figure 11:
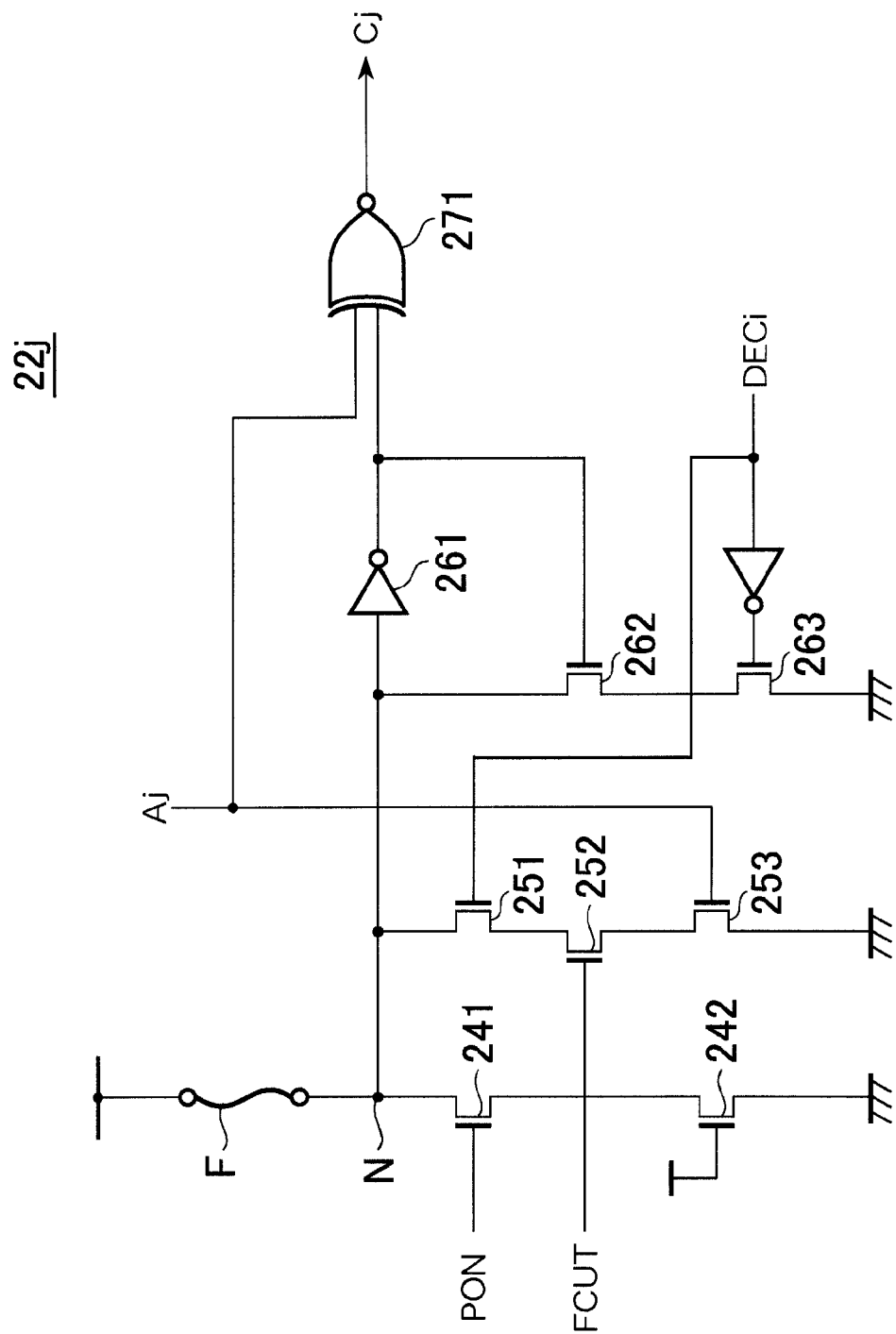
FIG. 11 is a circuit diagram showing a more detailed configuration of the unit circuit shown in FIG. 8.

FIG. 11 is a circuit diagram showing a more detailed configuration of the unit circuit 22j.

The circuit shown in FIG. 11 has transistors 241 and 242 connected in series between the contact node N as the other end of the fuse element F and a ground wiring. These transistors 241 and 242 correspond to the detection circuit 240 shown in FIG. 8. The power on signal PON which is activated at the reset time of the semiconductor memory device is supplied to the gate of the transistor 241. On the other hand, the gate of the transistor 242 is fixed to the power source potential, and functions as a current limit element that limits the amount of current flowing through the transistor 241.

Therefore, when the power on signal PON is activated, the fuse element F is temporarily connected to the ground wiring. However, because the current is limited by the transistor 242, the fuse element F is not disconnected even when the transistor 241 is turned on.

The circuit shown in FIG. 11 further has transistors 251 to 253 connected in series between the contact node N as the other end of the fuse element F and the ground wiring. These transistors 251 to 253 correspond to the write circuit 250 shown in FIG. 8. The corresponding fuse set selection signal DECi is supplied to the gate of the transistor 251, the fuse disconnection signal FCUT is supplied to the gate of the transistor 252, and the corresponding bit Aj in the address signal ADD is supplied to the gate of the transistor 253. The on current capable of disconnecting the fuse element F can pass through the transistors 251 to 253. Accordingly, when all the transistors 251 to 253 are turned on, the fuse element F changes from the non-disconnected state shown in FIG. 9 to the disconnected state shown in FIG. 10.

An inverter 261 and transistors 262 and 263 shown in FIG. 11 correspond to the latch circuit 260 shown in FIG. 8. An input end of the inverter 261 is connected to the contact node N. The transistor 262 is connected to between the contact node N and the ground wiring, and the output of the inverter 261 is fed back to the gate of the transistor 262. Further, an inverted signal of the corresponding fuse set selection signal DECi is supplied to the gate of the transistor 263. Based on this configuration, when the power on signal PON is temporary activated, the output of the inverter 261 becomes at the low level when the fuse element F is in the non-disconnected state, and the output of the inverter 261 becomes at the high level when the fuse element F is in the disconnected state.

However, during the period when the fuse set selection signal DECi is at the active level (high level), the transistor 263 is in the off state, and, therefore, a latch operation is not performed. This is because the transistors 251 to 253 correctly control the disconnection current amount of the fuse element F.

Further, an EXNOR (exclusive NOR) circuit 271 shown in FIG. 11 corresponds to the determination circuit 270 shown in FIG. 8. The EXNOR circuit 271 receives the corresponding bit Aj in the address signal ADD and the output of the inverter 261, and sets the coincidence signal Cj to the high level when the bit Aj and the output of the inverter 261 coincide with each other.

After the address of the memory cell having a defect is specified in an operation test carried out in the wafer state, the fuse element F is disconnected corresponding to the specified defective address.

Figure 12:
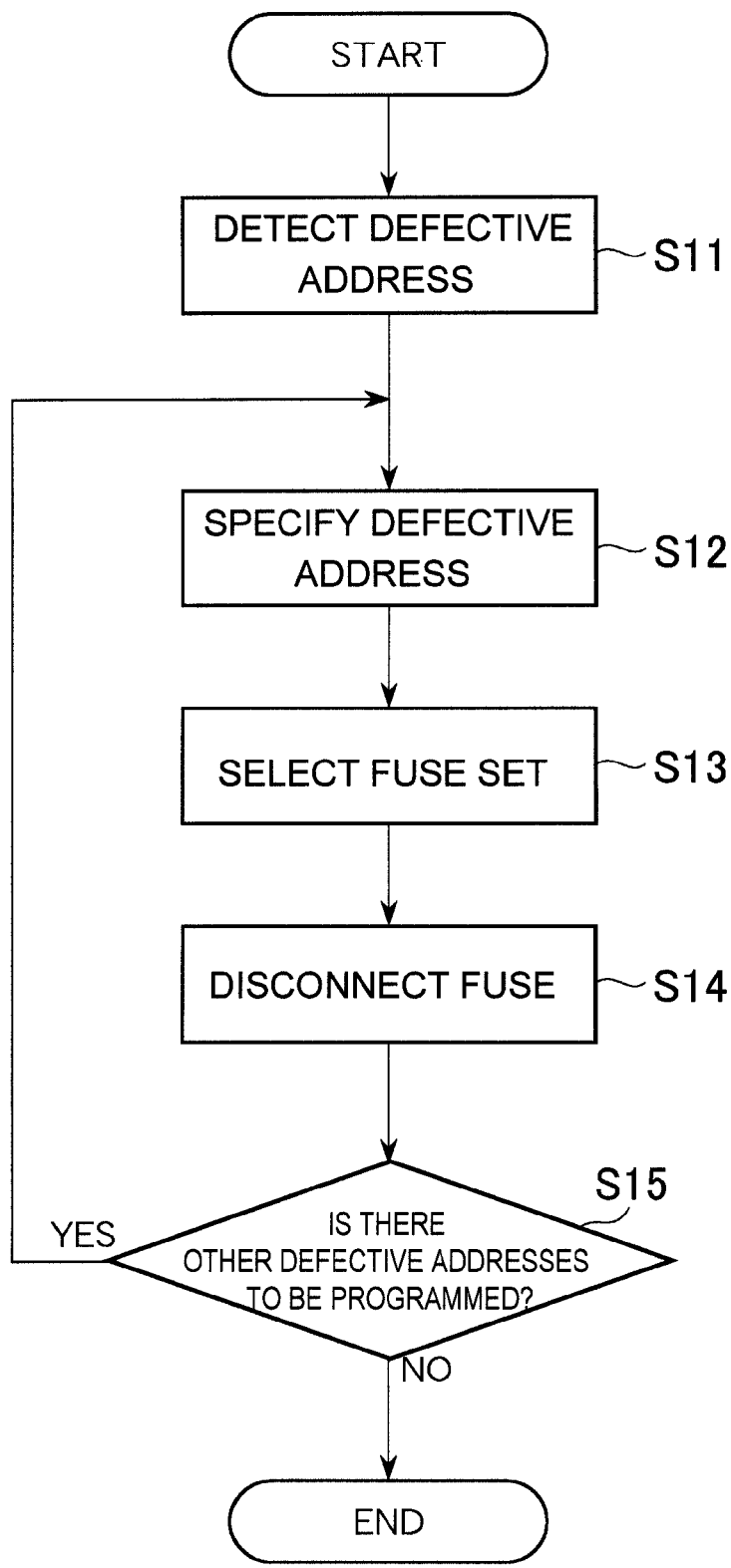
FIG. 12 is a flowchart for explaining a method of programming in the program circuit.

FIG. 12 is a flowchart for explaining a method of programming in the program circuit 200.

First, the operation test is performed in the wafer state, thereby detecting defective addresses (step S11). Next, any one of the detected defective addresses is specified (step S12), and any one fuse set is selected using the fuse set selection signals DEC1 to DECm (step S13). The fuse set selection circuit 130 shown in FIG. 1 decodes the input data to select a fuse set. As a result, any one (for example, DECi) of the fuse set selection signals DEC1 to DECm is activated, and the defective address can be written to the corresponding fuse set 20i.

In this state, the fuse disconnection signal FCUT is activated to the high level, and the defective address is supplied (step S14). Accordingly, the disconnection current flows to the fuse element F of which corresponding bit of the defective address is "1", out of the fuse elements F included in the selected fuse set 20i via the transistors 251 to 253. Consequently, the recording layer 103 and the lower electrode layer 102 constituting the fuse element F are physically separated, and the fuse element F is disconnected. On the other hand, no disconnection current flows to the fuse element F of which corresponding bit of the defective address is "0", and the physical contact between the recording layer 103 and the lower electrode layer 102 is maintained.

When other defective address to be programmed is present (step S15: YES), the defective address is specified returning back to step S12. On the other hand, when other defective address to be programmed is not present (step S15: NO), a series of program process ends.

In the above process, each defective address is written into any one of the fuse sets 201 to 20m included in the program circuit 200. Therefore, when the power on signal PON is temporarily activated by the reset operation, the defective address is latched by the latch circuit 260, and the address determination using the determination circuit 270 becomes possible. When the defective address is actually supplied from the outside, any one of the detection signals HIT1 to HITm becomes active, and the address replacement circuit 210 replaces the address with the alternated address.

As explained above, according to the semiconductor memory device of the first embodiment, the fuse element F includes the recording layer 103 made of the phase change material. By physically separating the recording layer 103 from the lower electrode layer 102, the defective address is stored irreversibly. Therefore, the semiconductor memory device can increase the reliability of the product without having the passivation film destroyed, unlike the semiconductor memory device of the type that stores the defective address by disconnecting the fuse element using the laser beam. Further, because no laser beam is used at the disconnection time, other elements or wirings can be located near the fuse element F (above the fuse element F, for example) In other words, because the vicinity of the fuse element F does not become the dead space, integration can be increased.

Furthermore, because the phase change material has a relatively low melting point, it also has an advantage in that the material can be disconnected very easily and securely, as compared with the type of a fuse element made of polycrystalline silicon which is fused by a large current. Specifically, a voltage necessary to disconnect the fuse element F according to the first embodiment is about two to three volts, and a time required for the disconnection is about a few dozens to a few hundred μs. A resistance value of the fuse element F before the disconnection is about a few K to a few dozens of KΩ, and a resistance value after the disconnection is in the MΩ order. Therefore, a sense circuit that determines a nonconductive state or conductive state is not necessary, unlike the antifuse.

Further, in the first embodiment, the nonvolatile memory element PC included in the memory cell MC and the fuse element F have substantially the same configurations. Therefore, these elements can be formed in the same process, and the additional process of forming the fuse element F is not necessary. In the first embodiment, the diameter D2 of the lower electrode layer 102 included in the fuse element F is set larger than the diameter D1 of the lower electrode layer 102 included in the nonvolatile memory element PC. Therefore, a variation of the resistance value of the fuse element F in the initial state can be decreased.

As explained above, in the first embodiment, while a variation of the resistance value in the initial state is decreased by increasing the diameter D2 of the lower electrode layer 102 included in the fuse element F, reliability can be more increased by providing a unit that can confirm whether the fuse element F is in the low resistance state in the initial state. A second embodiment of the present invention that confirms the resistance state of the fuse element F in the initial state is explained below.

Figure 13:
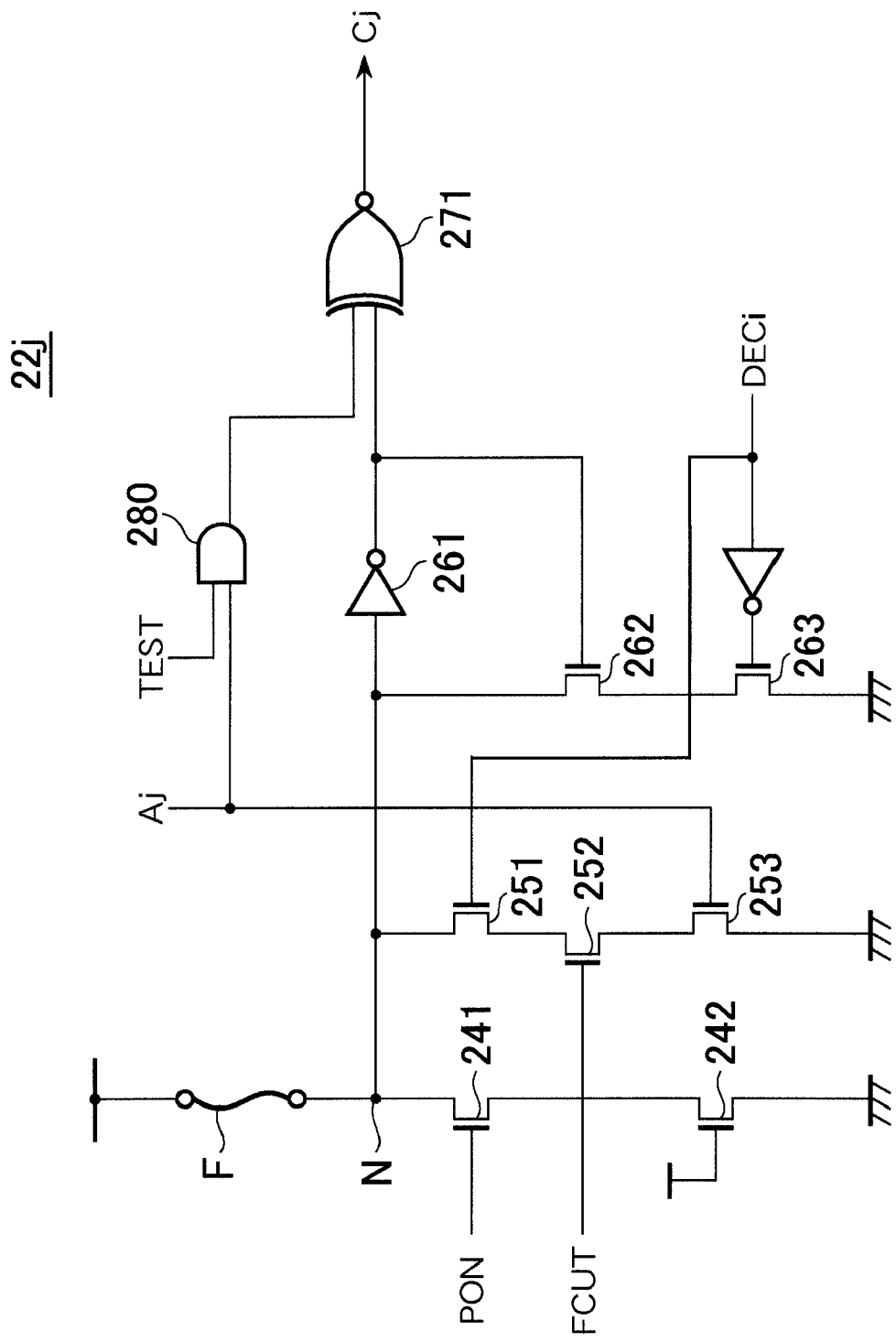
FIG. 13 is a circuit diagram of the unit circuit used in the second embodiment of the present invention.

FIG. 13 is a circuit diagram of the unit circuit 22j used in the second embodiment. The unit circuit 22j additionally includes a circuit that confirms whether the fuse element F is in the low resistance state in the initial state. Specifically, the unit circuit 22j is added with an AND circuit 280 that receives the corresponding bit Aj of the address signal ADD and a test signal TEST, and the output is supplied to the EXNOR circuit 271. Other configurations are the same as those of the circuit shown in FIG. 11.

The test signal TEST is usually at the high level, and becomes at the low level during a test. Therefore, the unit circuit 22j usually performs exactly the same operation as that of the circuit shown in FIG. 11, and one input signal of the EXNOR circuit 271 is fixed to the low level during the test. Accordingly, during the test time, the coincidence signal Cj indicates whether the fuse element F is in the low resistance state or the high resistance state, regardless of the value of the address signal ADD. In other words, when the fuse element F is in the low resistance state, the coincidence signal Cj becomes in the high level, and when the fuse element F is in the high resistance state, the coincidence signal Cj becomes at the low level.

Figure 14:
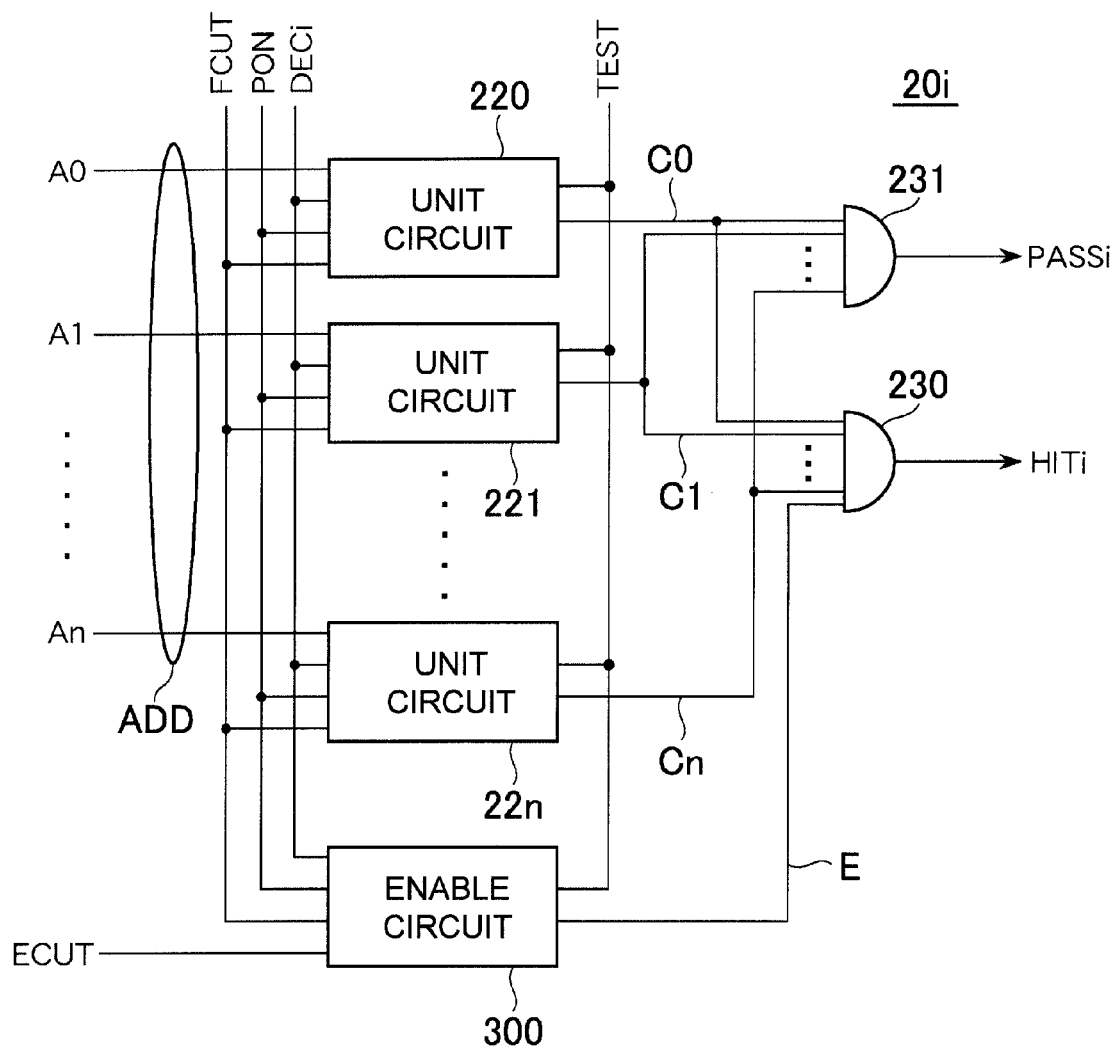
FIG. 14 is a block diagram showing a configuration of the fuse set used in the second embodiment.

FIG. 14 is a block diagram showing a configuration of the fuse set 20i used in the second embodiment.

The fuse set 20i shown in FIG. 14 is added with an enable circuit 300 and an AND circuit 231, unlike the fuse set 20i shown in FIG. 7. The test signal TEST is supplied to each of the unit circuits 220 to 22n and the enable circuit 300, and an invalidation signal ECUT is supplied to the enable circuit 300. The AND circuit 231 receives the coincidence signals C0 to Cn, and when all these coincidence signals become at the high level, the AND circuit 231 activates a determination signal PASSi at the high level.

An enable signal E as the output of the enable circuit 300 is added to the input of the AND circuit 230. Therefore, in the second embodiment, the detection signal HITi is activated when the enable signal E as well as the coincidence signals Co to Cn become at the high level. Other configurations are the same as those of the fuse set 20i shown in FIG. 7.

Figure 15:
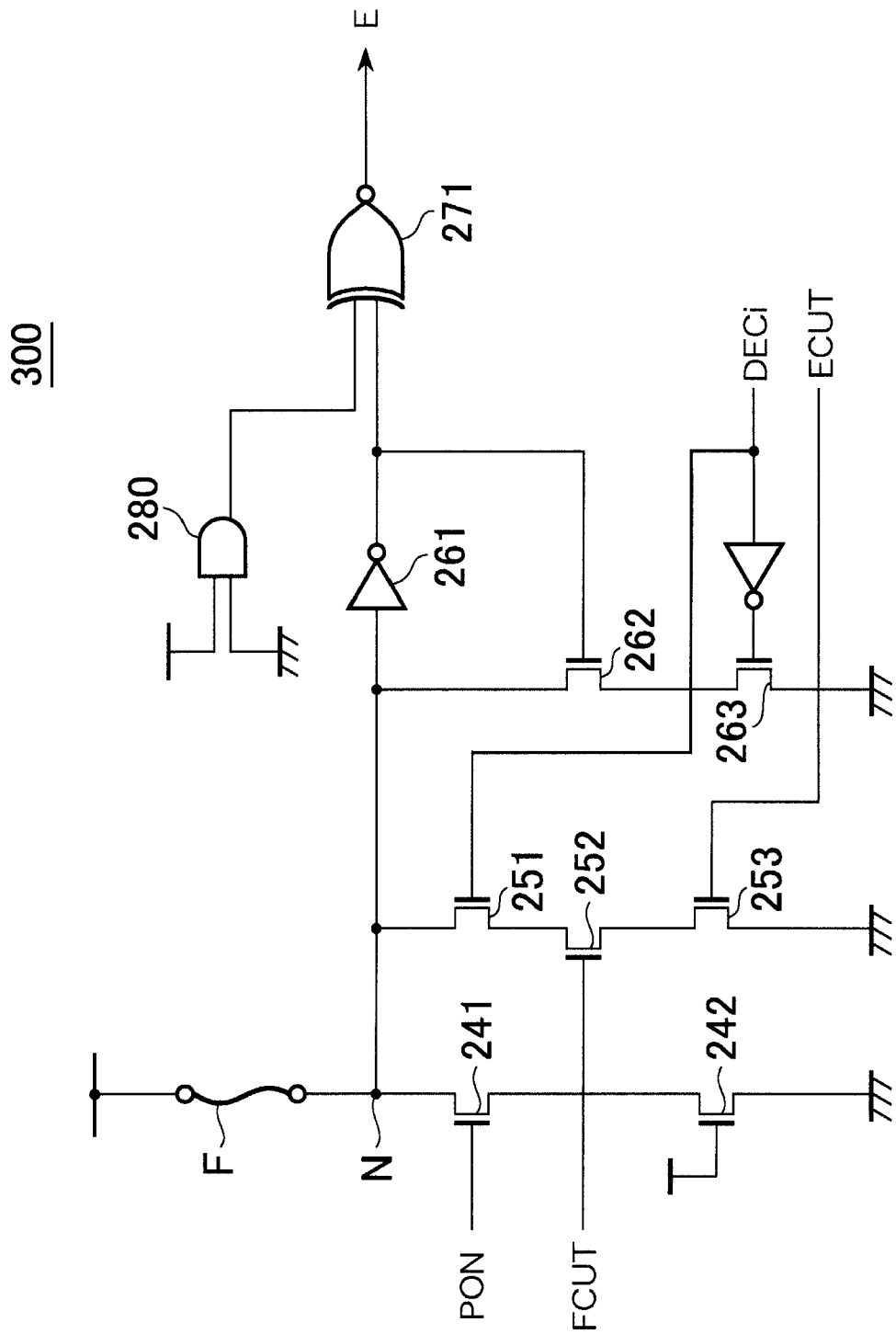
FIG. 15 is a circuit diagram of the enable circuit shown in FIG. 14.

FIG. 15 is a circuit diagram of the enable circuit 300.

As shown in FIG. 15, the gate of the transistor 253 of the enable circuit 300 is supplied with the invalidation signal ECUT, and input ends of the AND circuit 280 are fixed to the power source potential and the ground potential, respectively. Other configurations are similar to those of the unit circuit 22j shown in FIG. 13.

Figure 16:
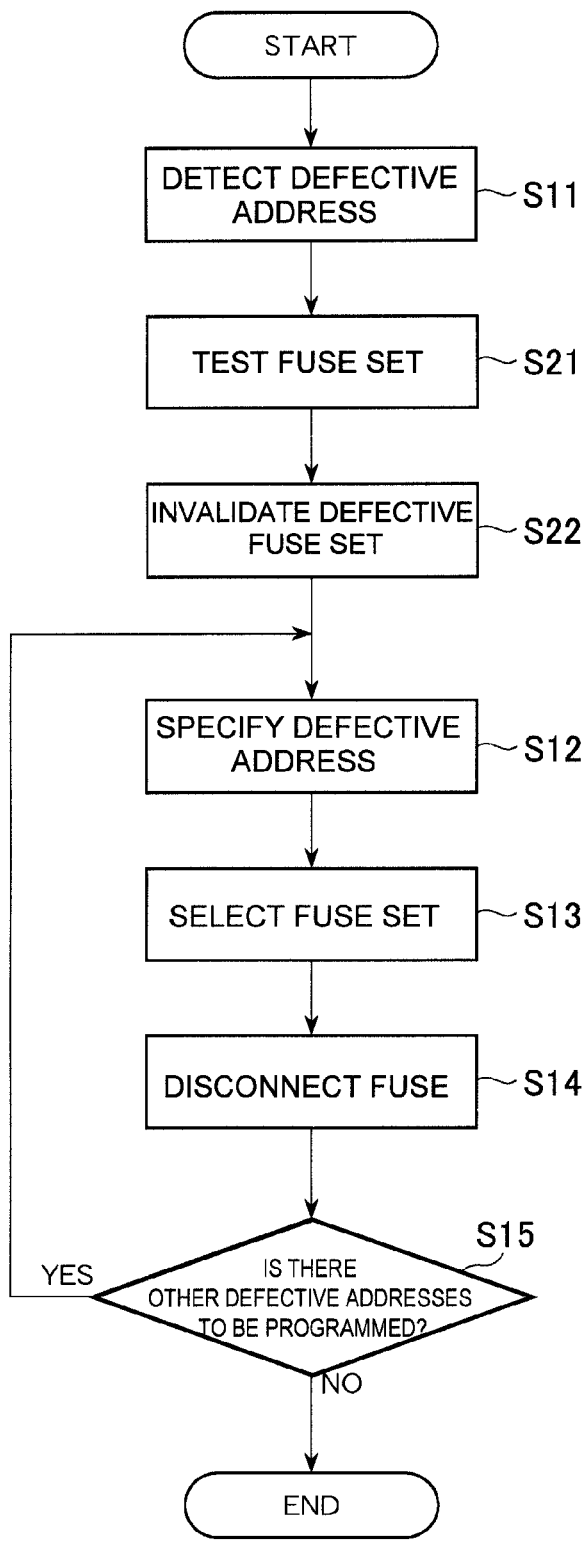
FIG. 16 is a flowchart for explaining the programming method according to the second embodiment.

FIG. 16 is a flowchart for explaining the programming method according to the second embodiment.

The programming method according to the second embodiment is different from the programming method shown in FIG. 12 in that a test of the fuse set (step S21) and an invalidation of the defective fuse set (step S22) are added after a detection of the defective address (step S11). The added steps S21 and S22 can be also executed before step S11.

The test of the fuse set (step S21) is performed by activating the test signal TEST to the low level. At this point of time, none of the fuse elements F is disconnected yet. Therefore, when the fuse elements F are in the correct low resistance state, all the coincidence signals C0 to Cn should be at the high level. Consequently, when all the fuse elements F included in the unit circuits 220 to 22n are in the low resistance state, the determination signal PASSi as the output of the AND circuit 231 should be at the high level.

However, when any one of the fuse elements F is in the high resistance state, the coincidence signal Cj as the output of the corresponding unit circuit 22j becomes at the low level. Therefore, the determination signal PASSi of the fuse set 20i is not activated, and remains at the low level.

Because this defective fuse set cannot correctly store the defective address, invalidation process is performed (step S22). The invalidation of the defective fuse set is performed, by activating the fuse set selection signal DECi corresponding to the defective fuse set to be invalidated, to the high level in the state that the invalidation signal ECUT is activated to the high level. As a result, the fuse element F of the enable circuit 300 included in the defective fuse set is disconnected. When the fuse element F of the enable circuit 300 is disconnected, the enable signal E as the output of the enable circuit 300 is fixed to the low level, and becomes in the unusable state.

After the fuse set is selected in this way, the defective address is written following the process described above (step S12 to step S15). In this case, the fuse set is selected at step S13 from the normal fuse sets of which the enable signal E is at the high level. The fuse set is not selected from the defective fuse sets of which the enable signal E is at the low level. With this arrangement, it is possible to avoid the use of a fuse set that cannot correctly store the defective address due to the variation of the resistance values in the initial state, and can further increase reliability.

As described above, in the second embodiment, while the fuse set including the fuse element in the high resistance state is invalidated, the invalidated fuse set can be relieved by providing a unit that sets the fuse element F to the low resistance state by initialization. A third embodiment of the present invention that can set the fuse element F to the low resistance by initialization is explained below.

Figure 17:
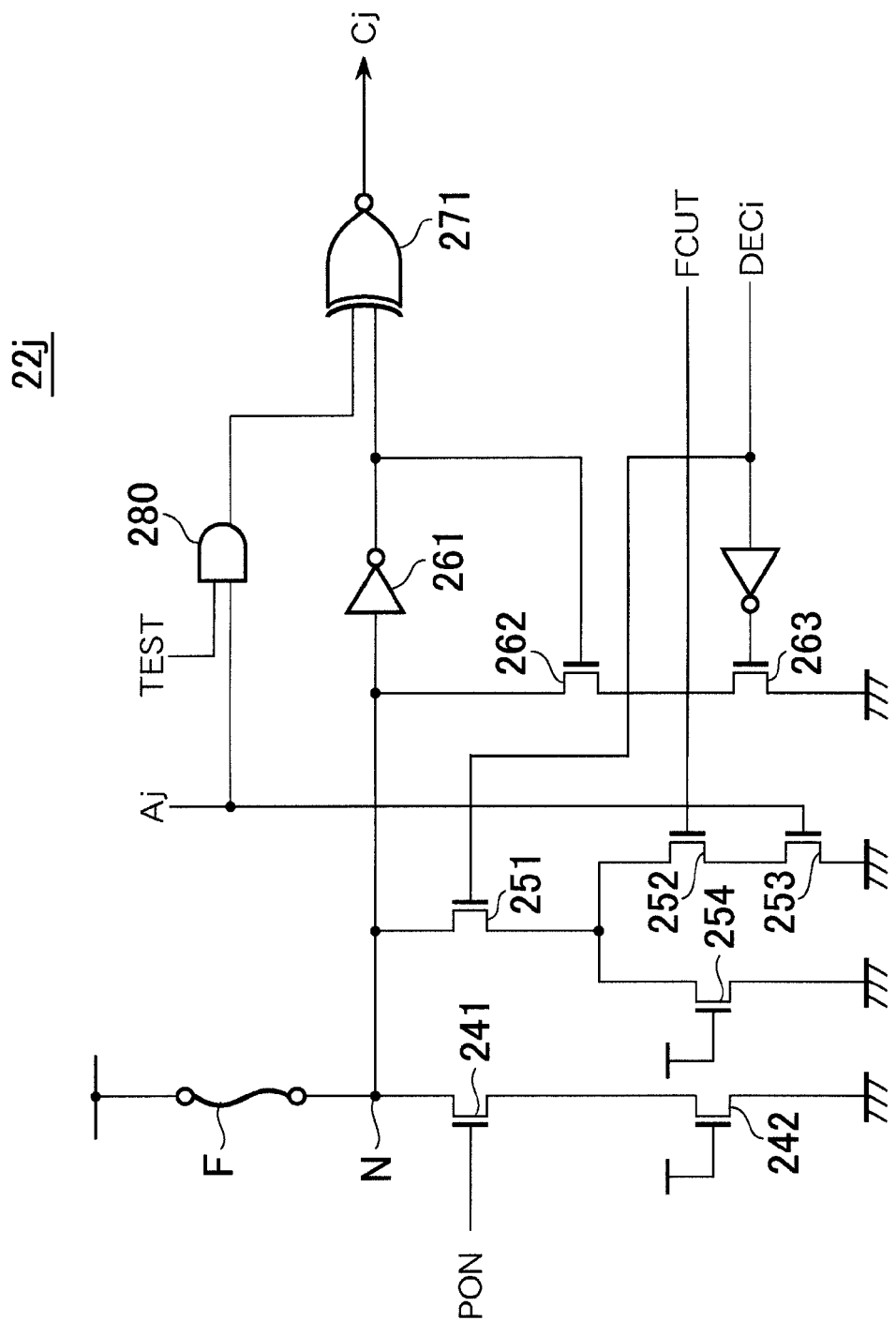
FIG. 17 is a circuit diagram of the unit circuit used in the third embodiment of the present invention.
Figure 18:
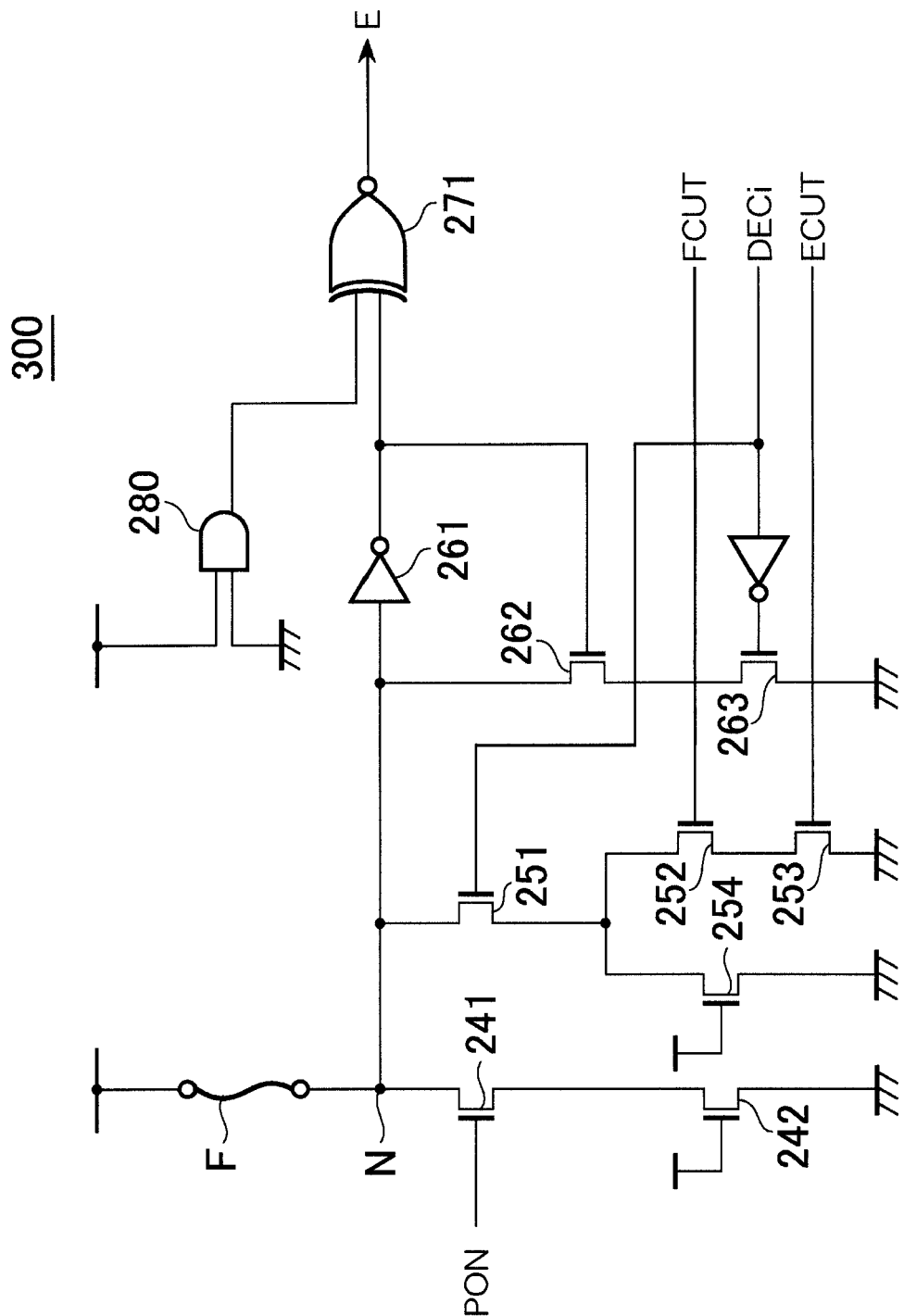
FIG. 18 is a circuit diagram of the enable circuit used in the third embodiment.

FIG. 17 and FIG. 18 are circuit diagrams of the unit circuit 22j and the enable circuit 300 used in the third embodiment, respectively.

As shown in FIG. 17 and FIG. 18, the unit circuit 22j and the enable circuit 300 used in the third embodiment are added with a circuit that sets the fuse element F to the low resistance state by initialization. Specifically, a transistor 254 that is connected in parallel with the transistors 252 and 253 is added, and a power source potential is supplied to the gate of the transistor 254. Other configurations are similar to those of the circuits shown in FIG. 13 and FIG. 15.

The transistor 254 passes an initialization current to the fuse element F. When the transistor 251 is turned on in the off state of the transistor 252, the initialization current flows to the fuse element F. The initialization current is smaller than the current passed at the disconnection time, and is set to a level at which the recording layer 103 included in the fuse element F is heated following the curve B shown in FIG. 4. Therefore, when the transistor 251 is turned on, the recording layer 103 included in the fuse element F is crystallized, and becomes in the low resistance state.

Figure 19:
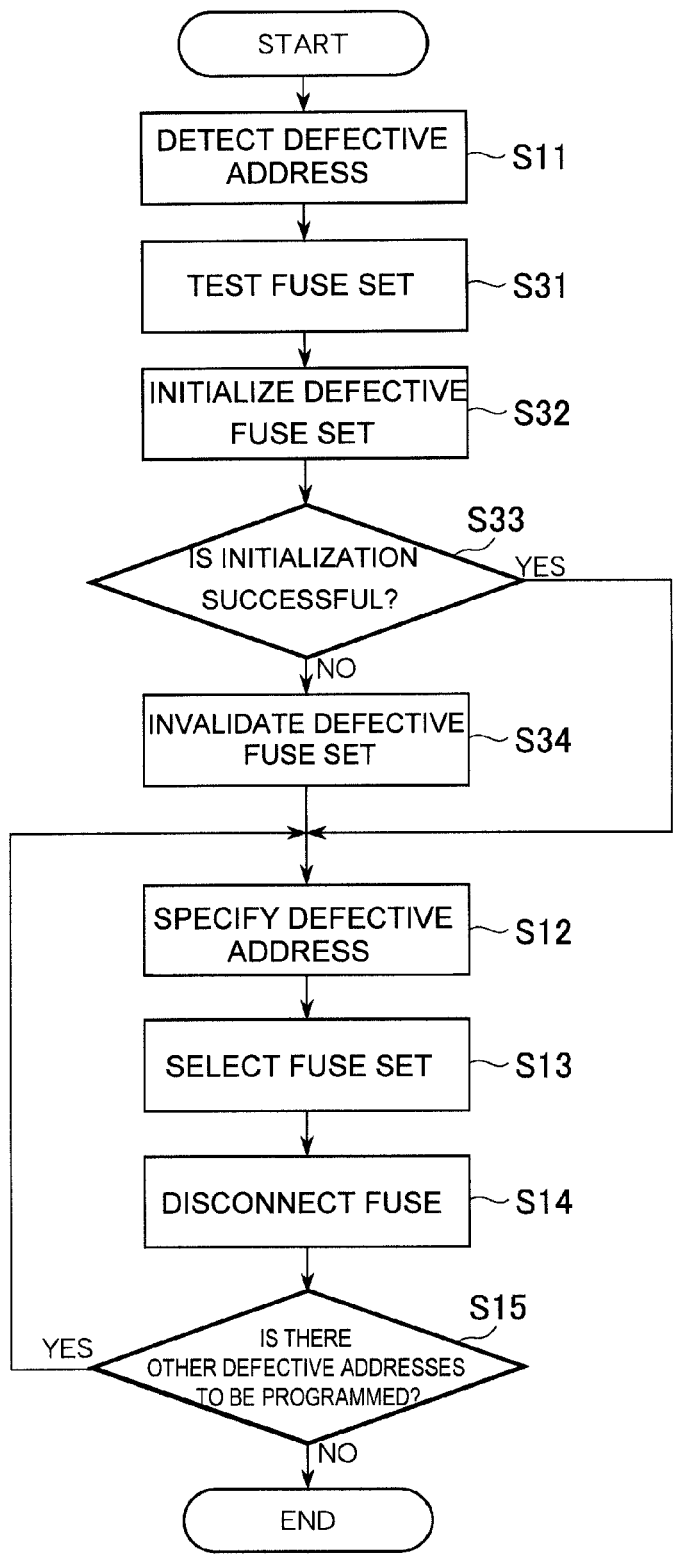
FIG. 19 is a flowchart for explaining the programming method according to the third embodiment.

FIG. 19 is a flowchart for explaining the programming method according to the third embodiment.

The programming method according to the third embodiment is different from the programming method shown in FIG. 12 in that a test of the fuse set (step S31), an initialization of the defective fuse set (step S32), a success determination of initialization (step S33), and an invalidation of the defective fuse set (step S34) are added after the detection of the defective address (step S11). The added steps S31 to S34 can be also executed before step S11.

The test of the fuse set (step S31) is the same as that at step S21, and is executed by activating the test signal TEST to the low level. As described above, none of the fuse elements F is disconnected at the point of time. Therefore, when all the fuse elements F included in the unit circuits 220 to 22n are in the low resistance state, the determination signal PASSi should become at the high level.

However, when any one of the fuse elements F is in the high resistance state, the coincidence signal Cj as the output of the corresponding unit circuit 22j becomes at the low level. Therefore, the determination signal PASSi of the fuse set 20i remains at the low level, without being activated.

Because the defective fuse set cannot correctly store the defective address in this state, the defective fuse set is initialized to relieve this (step S32). The defective fuse set is initialized by activating the fuse set selection signal DECi corresponding to the defective fuse set to be initialized, to the high level, in the state that the fuse disconnection signal FCUT is in the low level. With this arrangement, the initialization current flows to all the fuse elements F included in the defective fuse sets, and the recording layers 103 included in the fuse elements F are crystallized. As a result, the fuse elements F that are in the high resistance state also change to the low resistance state.

Next, whether the initialization has been successful is determined by testing the fuse set again (step S33). When the initialization of the fuse set is unsuccessful, that is, when the determination signal PASSi becomes at the low level even after the fuse set is initialized, this fuse set is invalidated (step S34). The invalidation process (step S34) is the same as that at step S22, and is performed by activating the fuse set selection signal DECi corresponding to the defective fuse set to be invalidated, to the high level, in the state that the invalidation signal ECUT is activated to the high level. The corresponding enable signal E is fixed to the low level, and the fuse set becomes unusable.

After the fuse sets are screened in this way, the defective address is written in the order as described above (step S12 to step S15). The fuse set is selected at step S13 from among the normal fuse sets of which the enable signal E is at the high level, and is not selected from the defective fuse sets of which the enable signal E is at the low level.

As described above, according to the third embodiment, because the defective fuse set is initialized, the fuse element F that is in the high resistance state in the initial state can be changed to the low resistance state. Accordingly, substantially all invalidated fuse sets can be avoided. While the initialization process (step S32) is executed to only the defective fuse set in the third embodiment, all fuse sets 201 to 20m can be also initialized by setting all the fuse set selection signals DEC1 to DECm to the high level.

A fourth embodiment of the present invention is explained next.

Figure 20:
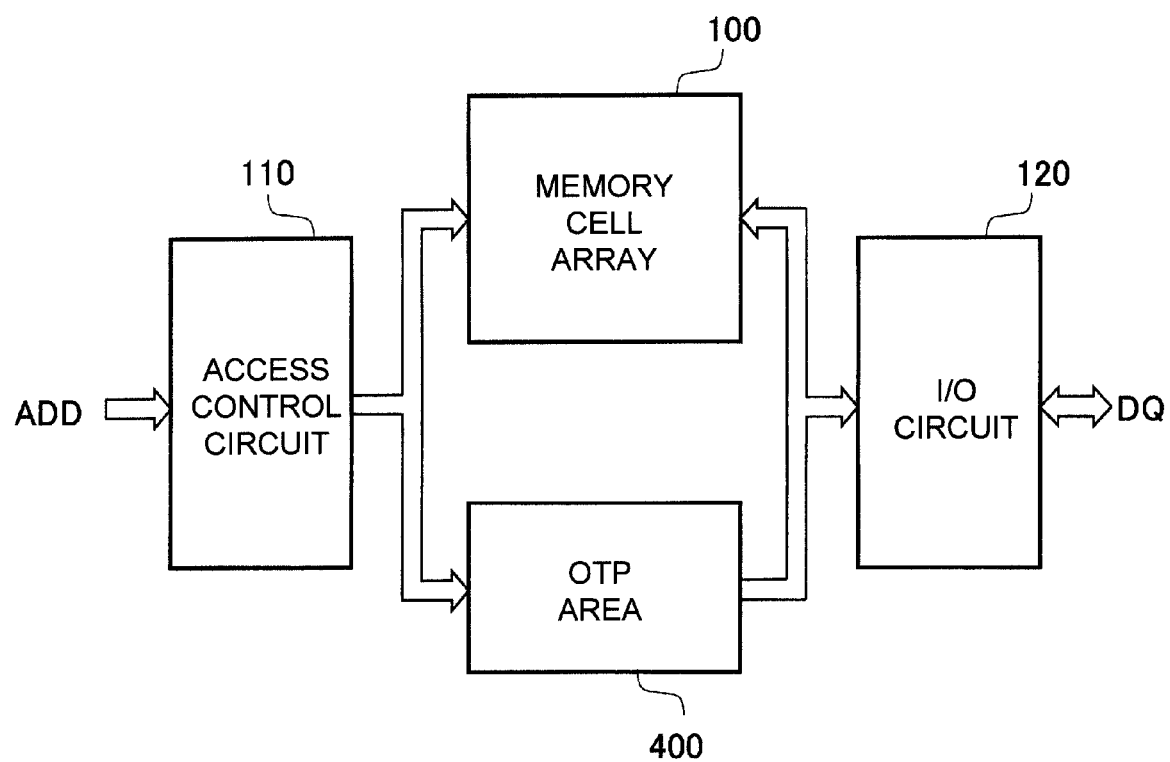
FIG. 20 is a block diagram schematically showing an entire configuration of a semiconductor memory device according to the fourth embodiment of the present invention.

FIG. 20 is a block diagram schematically showing an entire configuration of a semiconductor memory device according to the fourth embodiment.

As shown in FIG. 20, the semiconductor memory device according to the present embodiment includes an OTP area 400, in addition to the memory cell array 100, the access control circuit 110, and the I/O circuit 120. The memory cell array 100, the access control circuit 110, and the I/O circuit 120 are similar to those shown in FIG. 1. While the program circuit 200 and the fuse set selection circuit 130 are omitted in FIG. 20, the semiconductor memory device can also include the program circuit 200 and the fuse set selection circuit 130, like the semiconductor memory device shown in FIG. 1.

The OTP area 400 is an area for storing a user program and/or a vendor program. A program once stored in the OTP area 400 cannot be erased thereafter. That is, irreversible nonvolatile storage can be performed.

Figure 21:
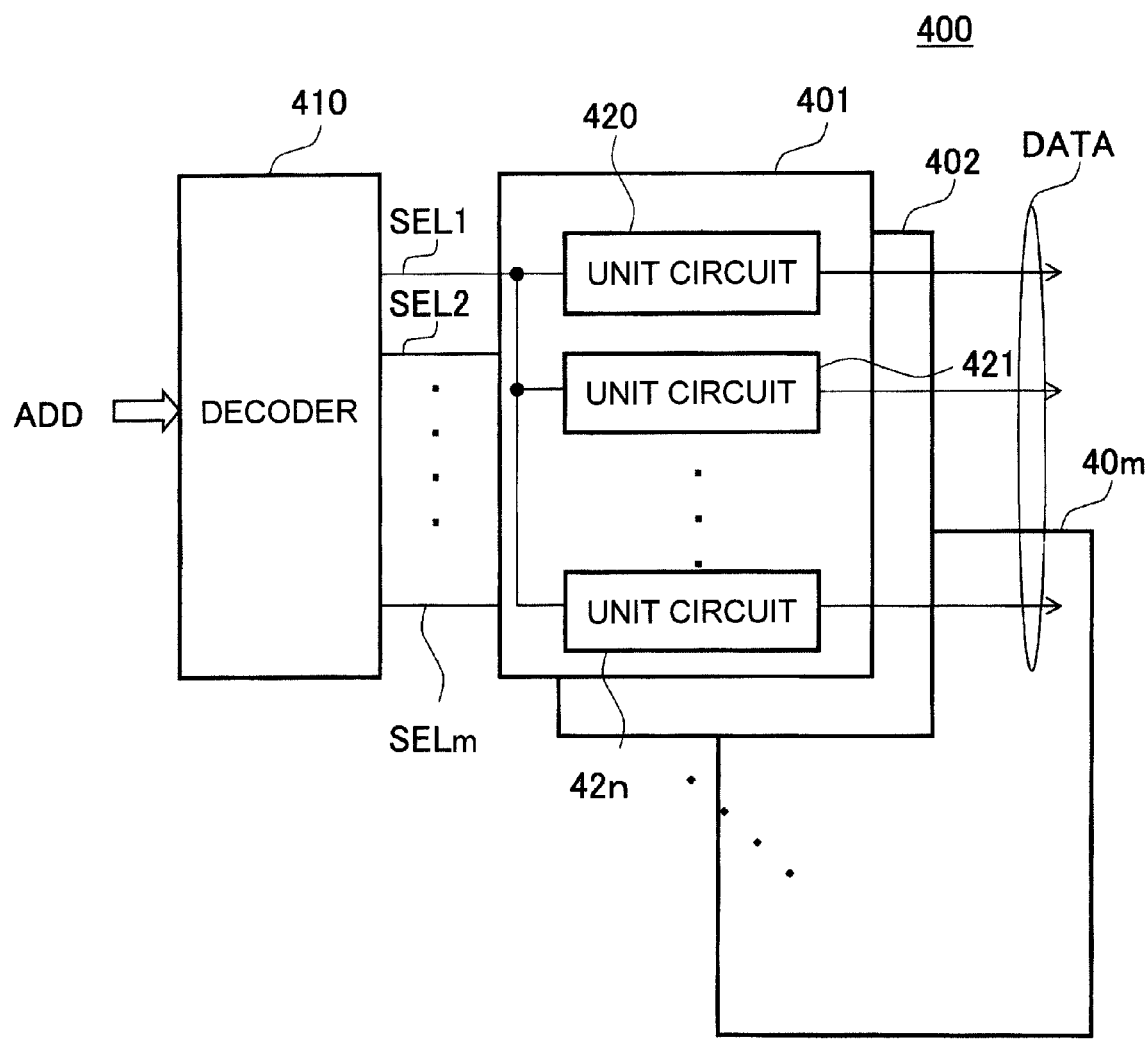
FIG. 21 is a block diagram showing the configuration of the OTP area shown in FIG. 20.

FIG. 21 is a block diagram showing the configuration of the OTP area 400.

As shown in FIG. 21, the OTP area 400 includes a decoder 410, and plural OTP registers 401 to 40m. The decoder 410 is a circuit that activates corresponding selection signals SEL1 to SELm by decoding an address signal ADD. These selection signals SEL1 to SELm are respectively supplied to corresponding OTP registers 401 to 40m.

Each OTP register 40i (i=1 to m) includes unit circuits 420 to 42n. Each of the unit circuits 420 to 42n has a circuit configuration which is the same as the circuit configuration of the unit circuit 22j shown in FIG. 11 or FIG. 17, except that the selection signal SELi is used in place of the bit Aj. Therefore, n+1 bit data DATA can be irreversibly nonvolatile-stored, by disconnecting the fuse element F contained in the unit circuits 420 to 42n. The output DATA of the unit circuits 420 to 42n are supplied to the I/O circuit 120 shown in FIG. 20, and are output to the outside.

Based on the above configuration, the semiconductor memory device according to the present embodiment can store user data of which reversible nonvolatile storage is necessary, into the memory cell array 100, and can store a user program and a vendor program of which irreversible nonvolatile storage is necessary, into the OTP area 400. Therefore, even when a vendor program and the like are stored in the OTP area 400 before packaging or before mounting, the program content is not destroyed by reflow.

In the above fourth embodiment, while the OTP area 400 has a configuration similar to that of the program circuit 200 shown in FIG. 6, the configuration of the OTP area 400 is not limited to this. Therefore, the OTP area 400 can also have a matrix configuration having memory cells MC laid out in the array shape at intersections between the word lines and the bit lines, like the memory cell array 100 shown in FIG. 2, for example.

A fifth embodiment of the present invention is explained next.

Figure 22:
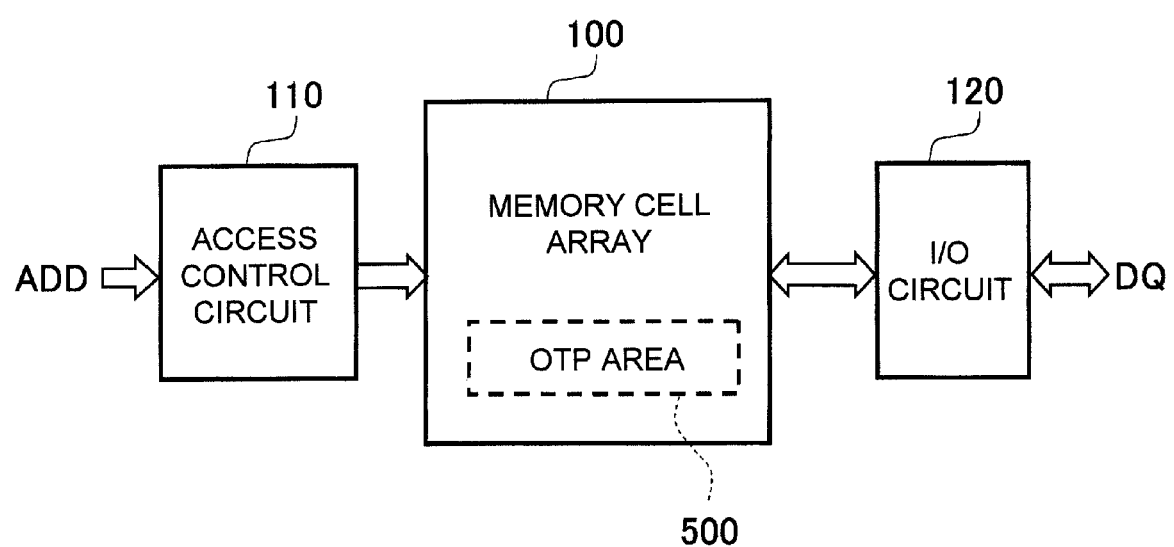
FIG. 22 is a block diagram schematically showing an entire configuration of a semiconductor memory device according to the fifth embodiment of the present invention.

FIG. 22 is a block diagram schematically showing an entire configuration of a semiconductor memory device according to the fifth embodiment.

As shown in FIG. 22, in the semiconductor memory device according to the present embodiment, an OTP area 500 constitutes a part of the memory cell array 100. In other words, a memory cell constituting a user area and a memory cell constituting an OTP area are present in mixture within the same memory cell array. While the program circuit 200 and the fuse set selection circuit 130 are also omitted in FIG. 22, the semiconductor memory device can also include the program circuit 200 and the fuse set selection circuit 130, like the semiconductor memory device shown in FIG. 1.

Figure 23A:
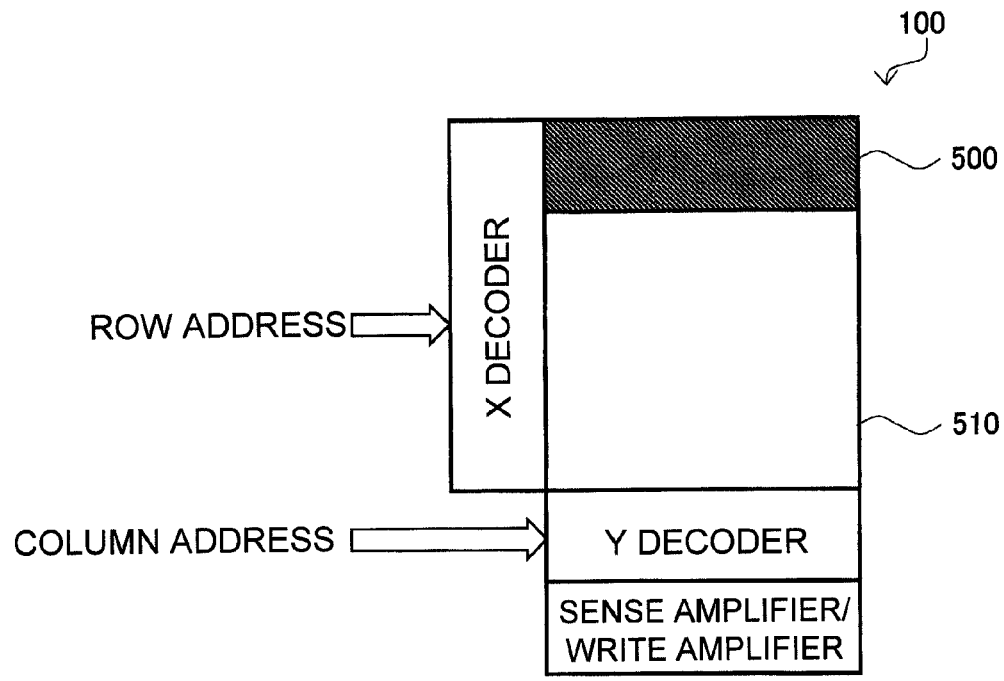
FIGS. 23A and 23B show configurations of the memory cell array according to the fifth embodiment.
Figure 23B:
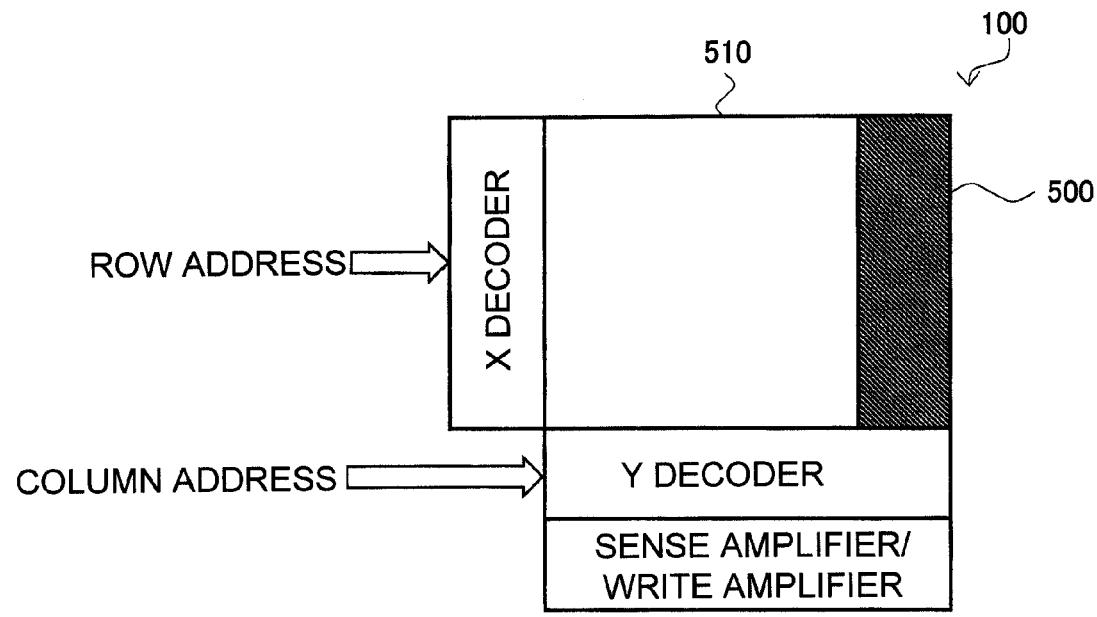

FIGS. 23A and 23B show configurations of the memory cell array 100 according to the present embodiment. In the example shown in FIG. 23A, a user area 510 is separated from the OTP area 500 by a row address, and in the example shown in FIG. 23B, the user area 510 is separated from the OTP area 500 by a column address. According to this configuration, a user program, a vendor program or the like stored in the OTP area 500 can be read out, by performing a normal access to the memory cell array 100.

While preferred embodiments of the present invention have been described hereinbefore, the present invention is not limited to the aforementioned embodiments and various modifications can be made without departing from the spirit of the present invention. It goes without saying that such modifications are included in the scope of the present invention.

In the above embodiments, while the phase change material such as the calcogenide material is used as the variable resistance material which constitutes the recording layer, the material is not limited to the phase change material so long as any variable resistance material of which electric resistance can reversibly change is used. Therefore, a magnetic resistance material of which electric resistance changes due to the application of a voltage pulse can be used. In this case, because the same magnetic resistance material is also used for the memory cell MC, it is preferable to configure what is called a RRAM. For this magnetic resistance material, a PrCaMnO material, such as $Pr_{1-x}Ca_xMnO_3$ can be used.

However, for the variable resistance material that constitutes the recording layer, it is most preferable to select the phase change material. Because the phase change material has the relatively low melting point, the cavity can be easily formed by the application of the current.

In the above embodiments, while the defective address is stored by physically separating the recording layer from the lower electrode layer, the electrode layer to be separated from the recording layer is not limited to the lower electrode layer, and other electrode layer (for example, the upper electrode layer) in contact with the recording layer can be also separated from the recording layer.

In the above embodiments, while a defective address, a vendor program or the like is stored by physically separating the recording layer from the lower electrode layer, the information to be stored is not limited to these. For example, individual information such as a lot number or information concerning what is called a fuse option for switching the function of the chip can be also stored.

What is claimed is:

1. A semiconductor memory device comprising:
   a recording layer including a variable resistance material of which electric resistance can reversibly change;
   an electrode layer which is in contact with the recording layer;
   a write circuit which physically separates the recording layer from the electrode layer by passing a current therethrough; and
   a detection circuit that detects a connection state between the recording layer and the electrode layer.

2. The semiconductor memory device as claimed in claim 1, further comprising a latch circuit that holds a logic value indicating a connection state detected by the detection circuit.

3. The semiconductor memory device as claimed in claim 1, further comprising:
   a plurality of bit lines;
   a plurality of word lines crossing the plurality of bit lines; and
   a plurality of nonvolatile memory elements located at intersections between the bit lines and the word lines,
   wherein each of the nonvolatile memory cell elements has substantially the same configurations as that of a storage unit including the recording layer and the electrode layer.

4. The semiconductor memory device as claimed in claim 3, wherein a contact area between the recording layer and the electrode layer constituting the storage unit is larger than a contact area between the recording layer and the electrode layer constituting the nonvolatile memory element.

5. The semiconductor memory device as claimed in claim 3, wherein the storage unit is used as a fuse element that stores an address of a defective memory cell.

6. The semiconductor memory device as claimed in claim 3, wherein the storage unit is used as a ROM element that stores a program.

7. The semiconductor memory device as claimed in claim 1, further comprising an initialization circuit that initializes in a predetermined resistance state the variable resistance material included in the recording layer.

8. The semiconductor memory device as claimed in claim 1, wherein the variable resistance material is a phase change material of which electric resistance is different depending on a phase state.

9. The semiconductor memory device as claimed in claim 1, wherein the variable resistance material is a magnetic resistance material of which electric resistance changes based on the application of a voltage pulse.

10. A semiconductor memory device comprising:
    a plurality of bit lines;
    a plurality of word lines crossing the plurality of bit lines;
    a plurality of memory cells located at intersections between the bit lines and the word lines; and
    a fuse element that stores an address of a defective memory cell,
    wherein the memory cell has a recording layer and an electrode layer connected in series with a corresponding bit line, the recording layer includes a variable resistance material of which electric resistance can reversibly change, and the fuse element has substantially the same configuration as that of a nonvolatile memory element included in the memory cell.

11. The semiconductor memory device as claimed in claim 10, wherein a contact area between the recording layer and the electrode layer constituting the fuse element is larger than a contact area between the recording layer and the electrode layer constituting the nonvolatile memory element.

12. The semiconductor memory device as claimed in claim 10, wherein the variable resistance material is a phase change material of which electric resistance is different depending on a phase state.

13. The semiconductor memory device as claimed in claim 12, wherein the nonvolatile memory element holds information based on a phase state of the phase change material included in the recording layer, and the fuse element holds information based on presence or absence of a physical contact between the recording layer and the electrode layer.

14. The semiconductor memory device as claimed in claim 12, further comprising:
    a circuit that physically separates the recording layer from the electrode layer by passing a write current to the fuse element; and
    an initialization circuit that crystallizes the phase change material included in the recording layer, by passing an initialization current to the fuse element,
    wherein the current amount of the write current is larger than the current amount of the initialization current.

15. The semiconductor memory device as claimed in claim 10, wherein the variable resistance material is a magnetic resistance material of which electric resistance changes based on the application of a voltage pulse.

16. A programming method for programming a defective address in the semiconductor memory device including:
    a plurality of bit lines;
    a plurality of word lines crossing the plurality of bit lines;
    a plurality of memory cells located at intersections between the bit lines and the word lines; and
    a fuse element that stores an address of a defective memory cell, wherein the memory cell has a recording layer and an electrode layer connected in series with a corresponding bit line, the recording layer includes a variable resistance material of which electric resistance can reversibly change, and the fuse element has substantially the same configuration as that of a nonvolatile memory element included in the memory cell, the programming method comprising:

an address specification step of specifying an address of a defective memory cell; and a write step of physically separating the recording layer from the electrode layer constituting a predetermined fuse element, corresponding to a specified defective address.

17. The programming method of the semiconductor memory device as claimed in claim 16, further comprising a determination step of determining a resistance state of the recording layer included in the fuse element, wherein the write step uses a plurality of fuse elements of which the recording layer is determined to be in the low resistance state.

18. The programming method of the semiconductor memory device as claimed in claim 16, further comprising an initialization step of crystallizing the phase change material included in the recording layer, by passing an initialization current to the fuse element.

19. The programming method of the semiconductor memory device as claimed in claim 18, further comprising an invalidation step of invalidating a fuse element of which the recording layer does not become in the low resistance state even when the initialization step is executed.

20. The programming method of the semiconductor memory device as in claim 18, further comprising an invalidation step of invalidating a fuse element if the recording layer does not enter a low resistance state when the initialization step is executed.

21. A semiconductor memory device, comprising:

a first memory cell capable of reversibly performing nonvolatile storage; and a second memory cell capable of irreversibly performing nonvolatile storage, wherein each of the first and the second memory cells includes a recording layer containing a variable resistance material of which electric resistance can reversibly change, and an electrode layer which is in contact with the recording layer.

22. The semiconductor memory device as claimed in claim 21, wherein the first memory cell can perform reversible nonvolatile storage by changing the electric resistance of the variable resistance material contained in the recording layer, and the second memory cell can perform irreversible nonvolatile storage by physically separating the recording layer from the electrode layer.

23. The semiconductor memory device as claimed in claim 21, wherein the first memory cell and the second memory cell are present in mixture within the same memory cell array.

24. A semiconductor device comprising:

a plurality of first address lines;

a plurality of second address lines;

a plurality of memory cells, each memory cell connected to one of the first address lines and one of the second address lines; and a fuse element that stores a location of a defective memory cell, wherein each memory cell comprises a recording layer and an electrode layer connected in series with the corresponding first address line, the recording layer comprising a variable resistance material of which an electric resistance of the material is reversibly changeable, and wherein the fuse element has substantially the same configuration as that of a nonvolatile memory element included in the memory cell.

25. A memory storage method for a semiconductor device, the method comprising:

reading a value of a memory cell of the device, the stored value indicated by a high resistance or a low resistance of a recording layer of the memory cell;

writing a new value to a memory cell by applying a current to the memory cell and thereby reversibly changing the phase state of the recording layer of the memory cell;

storing, with a fuse element, a location of a memory cell, if the memory cell is defective, by applying a higher current to the fuse element than the current used to write a new value to a memory cell, wherein the higher current irreversibly changes the resistance of the fuse element.

26. A semiconductor device comprising:

a program circuit comprising a fuse set;

an access control circuit connected to the program circuit; and a plurality of memory cells connected to the access control circuit, each memory cell comprising an electrode layer and a recording layer in contact with the electrode layer, the recording layer comprising a variable resistance material, an electric resistance of the material reversibly changeable, wherein the program circuit receives an address of a memory cell;

wherein the program circuit stores, with the fuse set, an address of a defective memory cell of the plurality of memory cells, and when the received address is that of the defective memory cell, supplies an alternative address to the access control circuit, and wherein the access control circuit accesses a redundant memory cell of the plurality of memory cells when the alternative address is supplied by the program circuit.

* * * * *